(12) United States Patent
Takehara et al.

(10) Patent No.: US 10,553,456 B2
(45) Date of Patent: Feb. 4, 2020

(54) SEMICONDUCTOR PACKAGE AND MANUFACTURING METHOD OF SEMICONDUCTOR PACKAGE

(71) Applicant: J-DEVICES CORPORATION, Oita (JP)

(72) Inventors: Yasuyuki Takehara, Ishikawa (JP); Kazuhiko Kitano, Ishikawa (JP)

(73) Assignee: J-Devices Corporation, Usuki (JP)

( * ) Notice: Subject to any disclaimer, the term of this patent is extended or adjusted under 35 U.S.C. 154(b) by 120 days.

(21) Appl. No.: 15/472,387

(22) Filed: Mar. 29, 2017

(65) Prior Publication Data
US 2017/0316996 A1 Nov. 2, 2017

(30) Foreign Application Priority Data

Apr. 28, 2016 (JP) ................. 2016-090189

(51) Int. Cl.
*H01L 21/56* (2006.01)
*H01L 23/29* (2006.01)
(Continued)

(52) U.S. Cl.
CPC ........ *H01L 21/561* (2013.01); *H01L 21/4871* (2013.01); *H01L 21/76873* (2013.01); *H01L 21/76874* (2013.01); *H01L 23/13* (2013.01); *H01L 23/142* (2013.01); *H01L 23/293* (2013.01); *H01L 23/295* (2013.01);
(Continued)

(58) Field of Classification Search
CPC ............ H01L 23/13; H01L 23/544; H01L 23/28–3192; H01L 2223/544–54493; H01L 24/26–33; H01L 2224/32151–3226; H01L 2224/32013; H01L 2224/26135–26145; H01L 2224/26165–26175; H01L 24/83; H01L 24/92; H01L 24/90; H01L 2223/54425; H01L 24/20; H01L 23/142; H01L 2223/54426; H01L 24/32; H01L 24/19; H01L 23/3128; H01L 23/3142
See application file for complete search history.

(56) References Cited

U.S. PATENT DOCUMENTS 6,426,565 B1 * 7/2002 Bhatt .............. H01L 23/13
257/731
6,713,849 B2 * 3/2004 Hasebe ............ H01L 23/3107
257/667
(Continued)

FOREIGN PATENT DOCUMENTS

CN 1501490 A 6/2004
JP 62-163962 10/1987
(Continued)

OTHER PUBLICATIONS

Technical Data Sheet HYSOL® FP4450, accessed at http://www-glast.slac.stanford.edu/Tracker-Hardware/ART/MCM&Cables/H-FP4450-EN.pdf, Feb. 15, 2018.*

*Primary Examiner* — Jasmine J Clark
(74) *Attorney, Agent, or Firm* — Kevin B. Jackson

(57) ABSTRACT

A semiconductor package includes a substrate having at least one recessed portion, a semiconductor device located on a surface of the substrate, the surface having the at least one recessed portion, and a resin insulating layer covering the semiconductor device.

13 Claims, 14 Drawing Sheets

(51) Int. Cl.
    *H01L 23/14*     (2006.01)
    *H01L 23/13*     (2006.01)
    *H01L 21/48*     (2006.01)
    *H01L 23/31*     (2006.01)
    *H01L 23/00*     (2006.01)
    *H01L 21/768*     (2006.01)
    *H01L 23/544*     (2006.01)
    *H01L 23/492*     (2006.01)

(52) U.S. Cl.
    CPC ...... *H01L 23/3121* (2013.01); *H01L 23/3142* (2013.01); *H01L 23/544* (2013.01); *H01L 24/32* (2013.01); *H01L 23/4926* (2013.01); *H01L 24/29* (2013.01); *H01L 2223/54426* (2013.01); *H01L 2223/54453* (2013.01); *H01L 2224/13113* (2013.01); *H01L 2224/13118* (2013.01); *H01L 2224/13139* (2013.01); *H01L 2224/13155* (2013.01); *H01L 2224/29011* (2013.01); *H01L 2224/2919* (2013.01); *H01L 2224/32245* (2013.01)

(56) References Cited

U.S. PATENT DOCUMENTS

| | | | |
|---|---|---|---|
| 2005/0029549 A1* | 2/2005 | Cobbley | H01L 21/565 257/202 |
| 2007/0059865 A1* | 3/2007 | Huang | H01L 21/561 438/123 |
| 2008/0067672 A1* | 3/2008 | Katoh | H01L 21/561 257/712 |
| 2008/0083994 A1 | 4/2008 | Lim | |
| 2010/0025847 A1* | 2/2010 | Tomura | H01L 21/563 257/737 |
| 2011/0044017 A1* | 2/2011 | Ono | H01L 23/055 361/771 |

FOREIGN PATENT DOCUMENTS

| | | |
|---|---|---|
| JP | 2003179193 A | 6/2003 |
| JP | 2010-278334 A | 12/2010 |
| JP | 2012253390 A | 12/2012 |
| JP | 2013069741 A | 4/2013 |
| JP | 2014179648 A | 9/2014 |

\* cited by examiner

SEMICONDUCTOR PACKAGE AND MANUFACTURING METHOD OF SEMICONDUCTOR PACKAGE

CROSS REFERENCE TO RELATED APPLICATIONS

This application is based upon and claims the benefit of priority from the prior Japanese Patent Application No. 2016-090189 filed on Apr. 28, 2016, the entire contents of which are incorporated herein by reference.

FIELD

The present invention relates to a semiconductor package and a manufacturing method of the same, and specifically, to a technology for mounting a semiconductor device on a substrate.

BACKGROUND

Conventionally, an electronic device such as a mobile phone, a smartphone or the like includes a semiconductor package structure including a support substrate and a semiconductor device such as an IC chip or the like mounted thereon (see, for example, Japanese Laid-Open Patent Publication No. 2010-278334). Generally, in such a semiconductor package, a semiconductor device such as an IC chip, a memory or the like is bonded on a support substrate with an adhesive layer being provided therebetween, and the semiconductor device is covered with a sealing member (formed of a resin material for sealing), so that the semiconductor device is protected.

The support substrate used for such a semiconductor device may be any of various substrates including a printed substrate, a ceramic substrate and the like. Especially recently, a semiconductor package including a metal substrate has been progressively developed. A semiconductor package including a metal substrate and a semiconductor device mounted thereon and fanned out by re-wiring has an advantage of being superb in electromagnetic shielding characteristics and thermal characteristics and now is a target of attention as a highly reliable semiconductor package. Such a semiconductor package also has an advantage of having a high degree of designing freedom.

In the case of a structure including a support substrate and a semiconductor device mounted thereon, a plurality of semiconductor devices may be mounted on a large support substrate, so that a plurality of semiconductor packages may be manufactured in one manufacturing process. In this case, the plurality of semiconductor packages formed on the support substrate are separated into individual pieces after the manufacturing process is finished, and thus individual semiconductor packages are provided. As can be seen from this, the semiconductor package structure including a support substrate and a semiconductor package mounted thereon also has an advantage of being high in mass-productivity.

The mass production using a large metal support substrate as a support substrate as described above requires high alignment precision of the semiconductor devices with respect to the metal substrate, good contact between the semiconductor devices and lines, high yield separation into individual semiconductor packages, or the like.

SUMMARY

A semiconductor package in an embodiment according to the present invention includes a substrate having at least one recessed portion, a semiconductor device located on a surface of the substrate, the surface having the at least one recessed portion, and a resin insulating layer covering the semiconductor device.

The semiconductor package may further include an adhesive layer between the substrate and the semiconductor device.

The adhesive layer may have an opening exposing the at least one recessed portion, and the resin insulating layer may be in contact with a side wall of the opening.

The at least one recessed portion may include at least two recessed portions, and the at least two recessed portions may be located at positions corresponding to opposing corners of the semiconductor device as seen in a plan view.

The resin insulating layer may be in contact with a side wall of the at least one recessed portion.

The resin insulating layer may fill the at least one recessed portion.

The at least two recessed portions may each have a size of 0.05 mm or greater and 1.0 mm or less.

The at least two recessed portions may each have a size of 0.1 mm or greater and 0.3 mm or less.

A distance between each of the at least two recessed portions and the semiconductor device may be 0.05 mm or greater and 0.5 mm or less.

A manufacturing method of a semiconductor package in an embodiment according to the present invention includes forming at least one recessed portion in a first surface of a substrate, locating a semiconductor device on the first surface of the substrate with positional alignment being performed by use of the at least one recessed portion, and forming a resin insulating layer covering the semiconductor device.

The manufacturing method of a semiconductor package may further include forming an adhesive layer on the first surface. The semiconductor device may be formed on the adhesive layer.

The manufacturing method of a semiconductor package may further include forming an opening, exposing the at least one recessed portion, in the adhesive layer. The resin insulating layer may be formed to contact a side wall of the opening.

The formation of the at least one recessed portion may be formation of at least two recessed portions, and the positional alignment may be performed by use of the at least two recessed portions.

The adhesive layer may be a sheet-like adhesive layer, and the sheet-like adhesive layer may be formed on the first surface to cover the at least one recessed portion, such that a gap is formed between the at least one recessed portion and the sheet-like adhesive layer.

The manufacturing method of a semiconductor package may further include roughening, by wet etching, a second surface opposite to the first surface of the substrate and a third surface connecting the first surface and the second surface. The opening may be formed in the adhesive layer after the second surface and the third surface are roughened.

The substrate may be formed of stainless steel, and the wet etching may be performed with an etchant containing Cu.

A manufacturing method of a semiconductor package in an embodiment according to the present invention includes forming a first recessed portion, a second recessed portion and a third recessed portion in a surface of a substrate, locating a first semiconductor device on the surface of the substrate having the first recessed portion and the second recessed portion, with positional alignment being performed by use of the first recessed portion and the second recessed portion, locating a second semiconductor device on the surface of the substrate having the second recessed portion and the third recessed portion, with positional alignment being performed by use of the second recessed portion and the third recessed portion, and forming a resin insulating layer covering the first semiconductor device and the second semiconductor device.

The manufacturing method of a semiconductor package may further include forming an adhesive layer on the substrate having the first recessed portion, the second recessed portion and the third recessed portion. The first semiconductor device and the second semiconductor device may be located on the adhesive layer.

The manufacturing method of a semiconductor package may further include forming, in the adhesive layer, a first opening exposing the first recessed portion, a second opening exposing the second recessed portion and a third opening exposing the third recessed portion. The resin insulating layer may be formed to contact a side wall of the first opening, a side wall of the second opening and a side wall of the third opening.

DESCRIPTION OF EMBODIMENTS

Figure 1A:
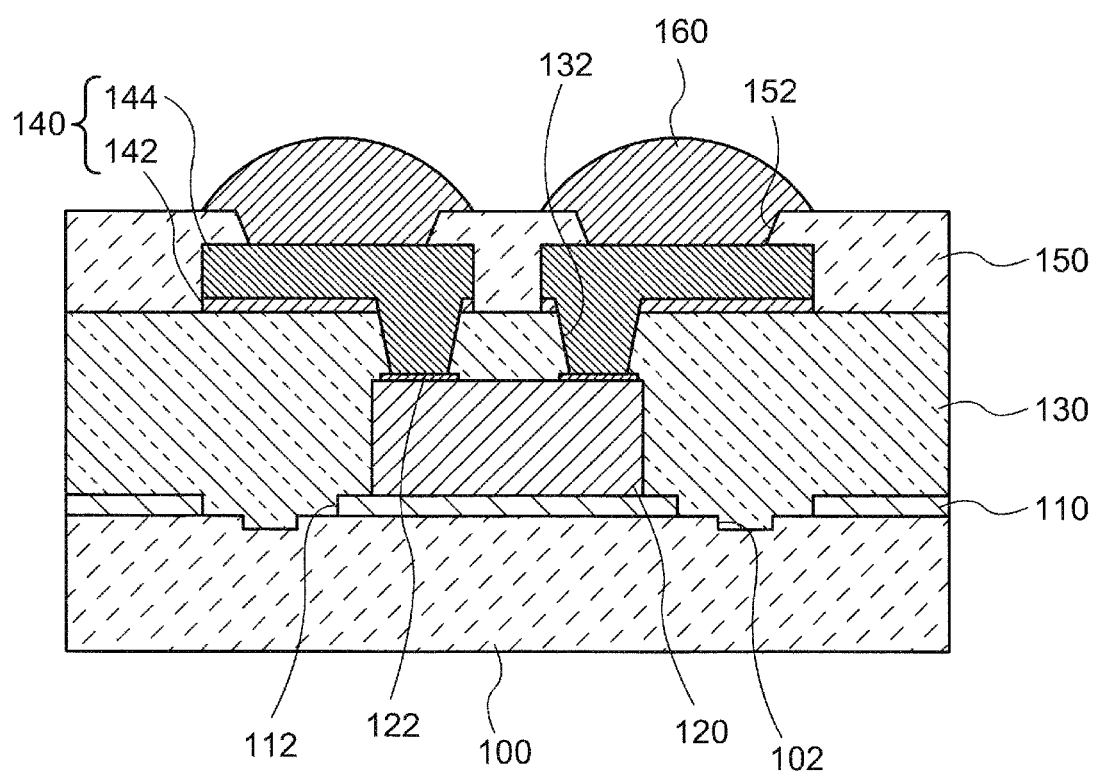
FIG. 1A is a schematic cross-sectional view of a semiconductor package in an embodiment according to the present invention.

Hereinafter, a structure of a semiconductor package and a manufacturing method of the same in embodiments according to the present invention will be described with reference to the drawings. The following embodiments are examples of the present invention, and the present invention is not construed as being limited to any of the embodiments. In the drawings referred to in this specification, components that are the same or have substantially the same functions as those shown in a previous drawing(s) bear the identical or similar reference signs thereto, and descriptions thereof may not be repeated. In the drawings, for the sake of illustration, the relative sizes may be different from the actual relative sizes, or a part of the structure may be omitted. For the sake of illustration, terms "above" and "below" may be used, but in the case where, for example, it is described that a first member is above a second member, the second member may be above the first member. In the following description, the phrase "first surface" or "second surface" used for a substrate does not refer to any specific surface of the substrate. The phrases "first surface" and the "second surface" are respectively used to specify the side of a top surface of the substrate and the side of a bottom surface of the substrate, namely, are used to specify the up-down direction with respect to the substrate.

Embodiment 1

Figure 1B:
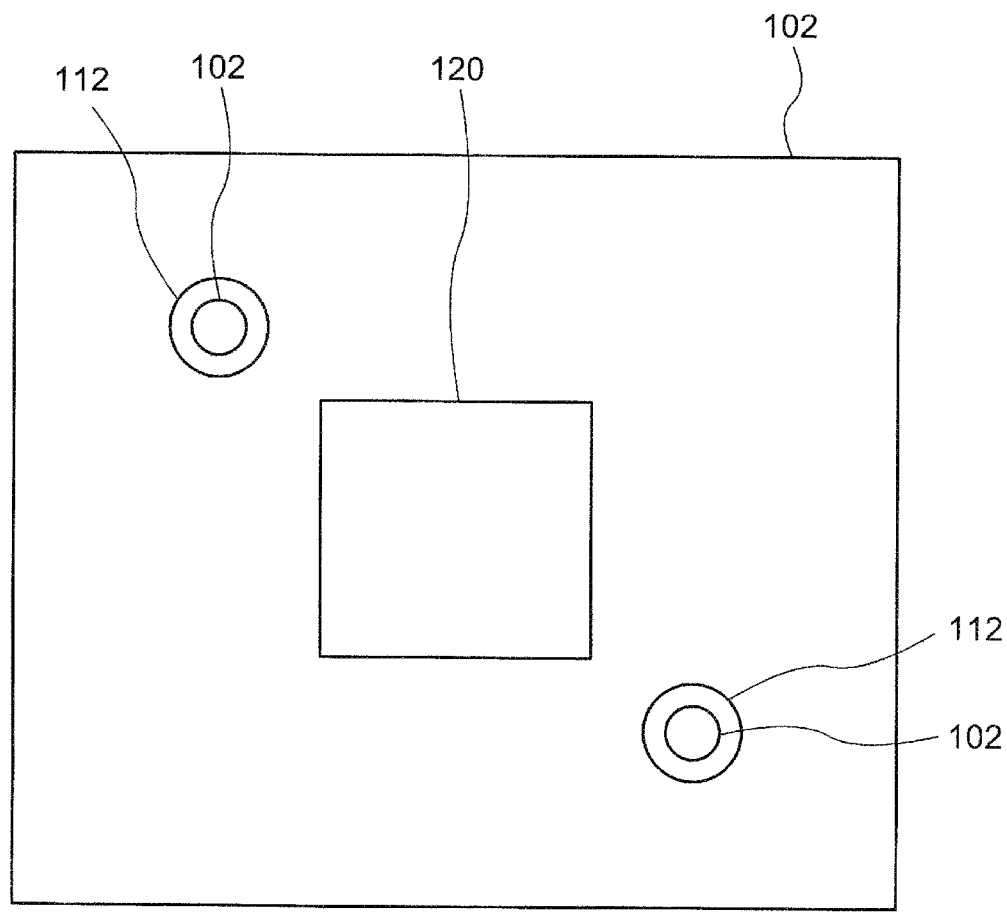
FIG. 1B is a schematic plan view showing the positional relationship between alignment markers and a semiconductor device in an embodiment according to the present invention.

With reference to FIG. 1A and FIG. 1B, an overview of a semiconductor package 10 in embodiment 1 according to the present invention will be described in detail. FIG. 1A is a schematic cross-sectional view of the semiconductor package 10 in embodiment 1 according to the present invention. FIG. 1B is a schematic plan view showing the positional relationship between alignment markers 102 and a semiconductor device 120 in embodiment 1 according to the present invention. FIG. 1B does not show components above the semiconductor device 120, for example, lines 140 and solder balls 160, for the sake of illustration.

(Structure of the Semiconductor Package 10)

As shown in FIG. 1A, the semiconductor package 10 includes a support substrate 100, an adhesive layer 110, the semiconductor device 120, a first resin insulating layer 130, the lines 140, a second resin insulating layer 150, and the solder balls 160. As shown in FIG. 1B, the alignment markers 102 are provided on the support substrate 100, at positions in the vicinity of the semiconductor device 120. In FIG. 1B, two alignment markers 102 are provided at positions corresponding to opposing corners of the semiconductor device 120 as seen in a plan view. In other words, alignment markers 102 are provided at positions extended from a diagonal line of the semiconductor device 120 as seen in a plan view.

The support substrate 100 is partially recessed to form the alignment markers 102 (recessed portions). In other words, the support substrate 100 used for the semiconductor package 10 is not flat. The adhesive layer 110 is located on a top surface (first surface) of the support substrate 100, and the adhesive layer 110 is partially opened to expose the alignment markers 102. The "top surface of the support substrate 100" refers to a surface thereof in which the alignment markers 102 are provided. The adhesive layer 110 has openings 112 formed therein, which are larger than the alignment markers 102. The openings 112 expose the alignment markers 102 and parts of the top surface of the support substrate 100 that are around the alignment markers 102.

The alignment markers 102 each have a size (largest diameter) that may be selected from the range of 0.05 mm or greater and 1.0 mm or less.

Preferably, the size of each alignment marker 102 may be 0.1 mm or greater and 0.3 mm or less. The distance between each alignment marker 102 and the semiconductor device 120 may be selected from the range of 0.05 mm or greater and 0.5 mm or less. Each alignment marker 102 may have a size recognizable by an alignment marker reading device. In the example shown in FIG. 1B, the alignment markers 102 are circular. Alternatively, the alignment markers 102 may have any other shape. The alignment markers 102 may each be a numerical figure or a letter. The "size of the alignment marker 102" refers to the largest size of each alignment marker 102. The "distance between each alignment marker 102 and the semiconductor device 120" refers to the shortest distance between each alignment marker 102 and the semiconductor device 120.

The semiconductor device 120 is located on the adhesive layer 110. On the semiconductor 120, external terminals 122 connected with an electronic circuit included in the semiconductor device 120 are located. In the example shown in FIG. 1A, the adhesive layer 110 is a single film layer. The adhesive layer 110 is not limited to having such a structure and may include a plurality of films. In the example shown in FIG. 1B, two alignment markers 102 are provided for one semiconductor device 120. The semiconductor package 10 is not limited to having such a structure. For example, at least one alignment marker 102 may be provided for one semiconductor device 120. Three or more alignment markers 102 may be provided for one semiconductor device 120.

The first resin insulating layer 130 is located on the support substrate 100 so as to cover the semiconductor device 120. The first resin insulating layer 130 is located to fill the openings 112 and the recessed portions acting as the alignment markers 102. In other words, the first resin insulating layer 130 is in contact with a side wall of each of the openings 112. Similarly, the first resin insulating layer 130 is in contact with a side wall of each of the alignment markers 102. The first resin insulating layer 130 has openings 132 formed therein. The openings 132 reach the external terminals 122. In other words, the openings 132 are provided so as to expose the external terminals 122.

In the example shown in FIG. 1A, the side wall of each opening 112 is vertical, and the side wall of each opening 112 and a top surface of the adhesive layer 110 make a right angle. The semiconductor package 10 is not limited to having such a structure. For example, the side wall of each opening 112 may be tapered with respect to the vertical line to the top surface of the adhesive layer 110. The side wall may have a forward-tapered shape, namely, the diameter of the opening 112 may be increased upward from the bottom of the opening 112, or may have a reverse-tapered shape, namely, the diameter of the opening 112 may be decreased upward from the bottom of the opening 112. A portion between the side wall of each opening 112 and the top surface of the adhesive layer 110 may be curved. Namely, an angled edge between the side wall of each opening 112 and the top surface of the adhesive layer 110 (the border therebetween and the vicinity thereof) may be rounded.

The lines 140 include a first conductive layer 142 and a second conductive layer 144. The first conductive layer 142 is located on a top surface of the first resin insulating layer 130. The second conductive layer 144 is located on the first conductive layer 142 and in the openings 132, and is connected with the external terminals 122. In the example shown in FIG. 1A, the first conductive layer 142 is located only on the first resin insulating layer 130, and is not located in the openings 132 at all. The semiconductor package 10 is not limited to having such a structure. For example, the first conductive layer 142 may be partially located in the openings 132. The first conductive layer 142 and the second conductive layer 144 may each be a single film layer as shown in FIG. 1A, or alternatively, one of, or both of, the first conductive layer 142 and the second conductive layer 144 may include a plurality of films.

The second resin insulating layer 150 is located on the first resin insulating layer 130 so as to cover the lines 140. The second resin insulating layer 150 has openings 152 formed therein. The openings 152 reach the lines 140. In other words, the openings 152 are located so as to expose the lines 140.

The solder balls 160 are located in the openings 152 and on a top surface of the second resin insulating layer 150, and are connected with the lines 140. A surface of each of the solder balls 160 protrudes upward from the top surface of the second resin insulating layer 150. The protruding portion of each solder ball 160 is curved upward. The curved shape of each solder ball 160 may be arced or parabolic as seen in a cross-sectional view.

As described above, in the semiconductor package 10 in embodiment 1, the first resin insulating layer 130 is in contact with the side wall of each alignment marker 102 as a recessed portion, so that the adhesiveness between the adhesive layer 110 and the first resin insulating layer 130 is increased. For example, in the case where the alignment markers 102 are provided in the support substrate 100, the adhesive effect provided by the adhesive layer 110 is weakened in regions where the alignment markers 102 are provided. This may result in local delamination of the first resin insulating layer 130 from the support substrate 100, which may result in delamination of the first resin insulating layer 130 from the adhesive layer 110. However, in this embodiment, the first resin insulating layer 130 is in contact with the side wall of each alignment marker 102 as a recessed portion. Therefore, the local delamination of the first resin insulating layer 130 from the support substrate 100 is suppressed.

(Materials of Components of the Semiconductor Package 10)

The materials of each of components (layers) included in the semiconductor package 10 shown in FIG. 1A and FIG. 1B will be described in detail.

The support substrate 100 may be formed of a metal material such as stainless steel (SUS), aluminum (Al), titanium (Ti), copper (Cu) or the like.

Alternatively, the support substrate 100 may be formed of a semiconductor material such as silicon, silicon carbide, compound semiconductor or the like. It is preferable to use SUS for the support substrate 100 because SUS has a low coefficient of thermal expansion and costs low.

The adhesive layer 110 may be formed of an adhesive material containing an epoxy-based resin or an acrylic resin.

The semiconductor device 120 may be a central processing unit (CPU), a memory, a microelectromechanical system (MEMS) device, a semiconductor element for power (power device), or the like.

The first resin insulating layer 130 and the second resin insulating layer 150 may each be formed of polyimide, epoxy-based resin, polyimide resin, benzocyclobutene resin, polyamide, phenol resin, silicone resin, fluorocarbon resin, liquid crystal polymer, polyamideimide, polybenzoxazole, cyanate resin, aramid, polyolefin, polyester, BT resin, FR-4, FR-5, polyacetal, polybutyleneterephthalate, syndiotactic polystyrene, polyphenylenesulfide, polyetheretherketone, polyethernitrile, polycarbonate, polyphenyleneetherpolysulfone, polyethersulfone, polyarylate, polyetherimide, or the like. It is preferable to use an epoxy-based resin for the first resin insulating layer 130 and the second resin insulating layer 150 because the epoxy-based resin is superb in electric characteristics and processability.

The first resin insulating layer 130 used in this embodiment contains a filler. The filler may be an inorganic filler such as glass, talc, mica, silica, alumina or the like. The filler may be an organic filler such as a fluorocarbon resin filler or the like. The first resin insulating layer 130 does not need to contain a filler. In this embodiment, the second resin insulating layer 150 does not contain a filler. Alternatively, the second resin insulating layer 150 may contain a filler.

The first conductive layer 142 and the second conductive layer 144 may be formed of a metal material selected from copper (Cu), gold (Au), silver (Ag), platinum (Pt), rhodium (Rh), tin (Sn), aluminum (Al), nickel (Ni), palladium (Pd), chromium (Cr) and the like, and an alloy thereof. The first conductive layer 142 and the second conductive layer 144 may be formed of the same material or different materials.

The solder balls 160 may each of a spherical body formed of, for example, an Sn alloy containing a small amount of Ag, Cu, Ni, bismuth (Bi) or zinc (Zn) incorporated into Sn. Instead of the solder balls, general conductive particles may be used. For example, a particle formed of a resin and wrapped with a conductive film may be used as a conductive particle. Instead of the solder balls, a solder paste may be used. The solder paste may be formed of Sn, Ag, Cu, Ni, Bi, phosphorus (P), germanium (Ge), indium (In), antimony (Sb), cobalt (Co), lead (Pb) or the like.

(Manufacturing Method of the Semiconductor Package 10)

With reference to FIG. 2 through FIG. 23, a manufacturing method of the semiconductor package 10 in embodiment 1 according to the present invention will be described. In FIG. 2 through FIG. 23, the components that are the same as those shown in FIG. 1A and FIG. 1B bear the same reference signs. In the following description, a manufacturing method of the semiconductor package 10 using the support substrate 100 formed of SUS, the first resin insulating layer 130 formed of an epoxy-based resin, the first conductive layer 142 and the second conductive layer 144 formed of Cu, and the solder balls 160 formed of an Sn alloy will be described.

Figure 2:
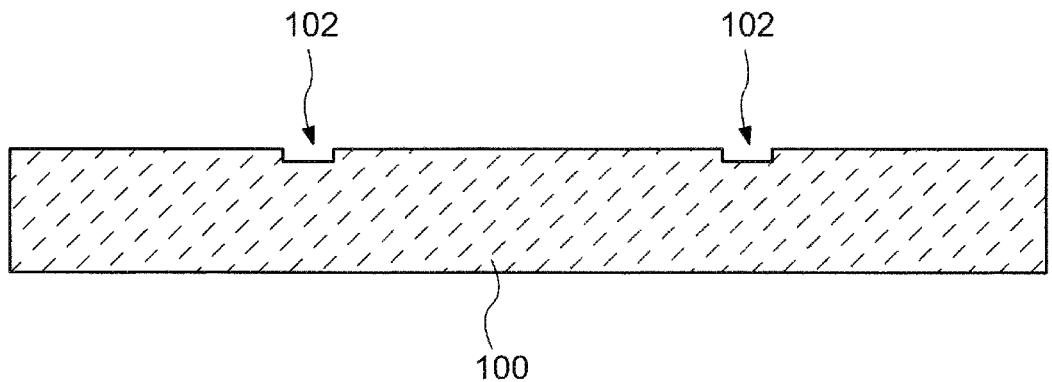
FIG. 2 shows a step of forming alignment markers in a support substrate in a manufacturing method of the semiconductor package in an embodiment according to the present invention.

FIG. 2 shows a step of forming the alignment markers 102 in the support substrate 100 in the manufacturing method of the semiconductor package 10 in embodiment 1 according to the present invention. The alignment markers 102 (recessed portions) are formed by photolithography and etching. The positions and the planar shape of the alignment markers 102 may be determined appropriately in accordance with the purpose of the semiconductor package 10. The alignment markers 102 may each have a stepped portion visually recognizable when the support substrate 100 is observed from above by an optical microscope or the like.

In the example shown in FIG. 2, two alignment markers 102 are formed for a region where the semiconductor device 120 is to be formed in a later step. The present invention is not limited to such a manufacturing method. For example, at least one alignment marker 102 may be provided for the region where one semiconductor device 120 is to be formed. Three or more alignment markers 102 may be provided for the region where one semiconductor device 120 is to be formed.

The alignment markers 102 may be formed by a method other than photolithography and etching described above. For example, the alignment markers 102 may be formed by laser irradiation performed on the top surface of the support substrate 100. According to an example of laser irradiation, a laser direct drawing device may be used that scans the support substrate 100 with laser light with no use of a mask to perform direct drawing on the support substrate 100. Alternatively, a mold shaped in correspondence with the alignment markers 102 may be used to form the support substrate 100 having the alignment markers 102 formed therein.

Figure 3:
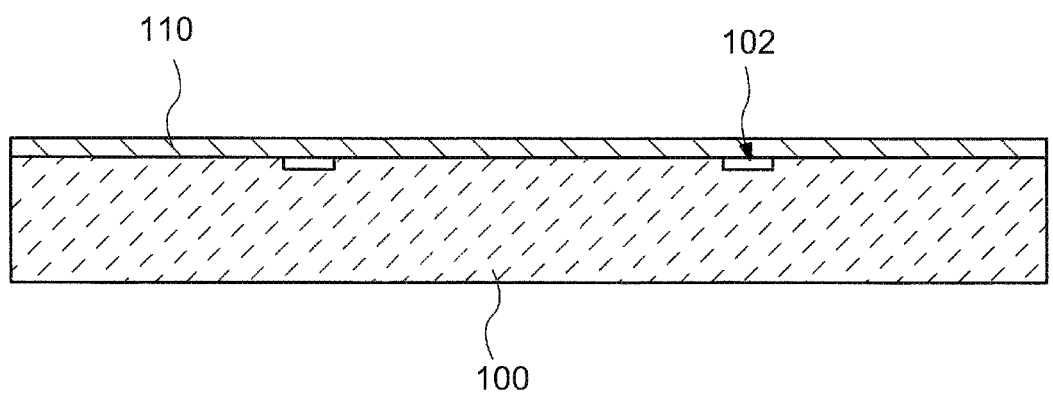
FIG. 3 shows a step of forming an adhesive layer on the support substrate in the manufacturing method of the semiconductor package in an embodiment according to the present invention.

FIG. 3 shows a step of forming the adhesive layer 110 on the support substrate 100 in the manufacturing method of the semiconductor package 10 in embodiment 1 according to the present invention. The adhesive layer 110 is formed on the top surface of the support substrate 100 having the alignment markers 102 formed therein. As the adhesive layer 110, a sheet-like adhesive layer is bonded. Alternatively, a solvent containing an adhesive material dissolved therein may be applied on the support substrate 100 to form the adhesive layer 110. In the example shown in FIG. 3, the recessed portions acting as the alignment markers 102 are hollow. Alternatively, the adhesive layer 110 may be formed to fill the recessed portions because such parts of the adhesive layer 110 that are in the alignment markers 102 will be removed in a later step.

Figure 4:
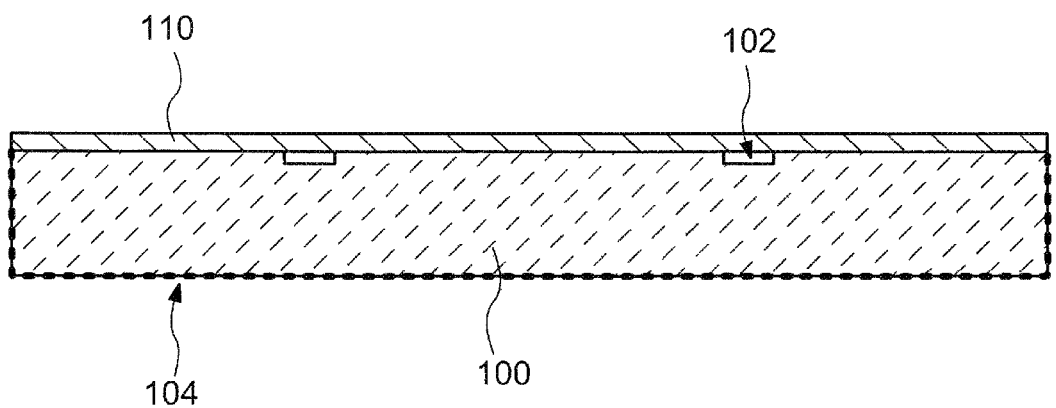
FIG. 4 shows a step of roughening a bottom surface and a side surface of the support substrate in the manufacturing method of the semiconductor package in an embodiment according to the present invention.

FIG. 4 shows a step of roughening a bottom surface (second surface) and a side surface (third surface; surface connecting the first surface and the second surface to each other) of the support substrate 100 in the manufacturing method of the semiconductor package 10 in embodiment 1 according to the present invention. The bottom surface and the side surface of the support substrate 100 are roughened for the purpose of suppressing a plating layer formed by electroless plating in a later step from being delaminated. The bottom surface and the side surface of the support substrate 100 may be roughened by use of a Cu-containing chemical (etchant). In FIG. 4, a region 104 that is roughened (roughened region 104) is represented by the dashed line.

The roughening of the support substrate 100 will be described in more detail. In the case where the support substrate 100 is formed of SUS, a surface of the SUS substrate is passivated. Cu ion contained in the etchant is replaced with at least one of Fe, Cr and Ni in the SUS substrate. The SUS substrate is etched by the replacement of the Cu ion with at least one of Fe, Cr and Ni. However, the etching on the SUS substrate progresses locally. Therefore, the SUS substrate is etched non-uniformly. As a result, the post-etching surface of the SUS substrate is highly rough. The SUS substrate is immersed in the etchant in the state shown in FIG. 4, so that the roughening of the bottom surface and the side surface of the SUS substrate is performed in the same step with the roughening of the top surface of the SUS.

In this example, the SUS substrate is roughened after the adhesive layer 110 is bonded. The present invention is not limited to such a manufacturing method. For example, the SUS substrate may be roughened before the adhesive layer 110 is bonded, or before the alignment markers 102 are formed.

Figure 5:
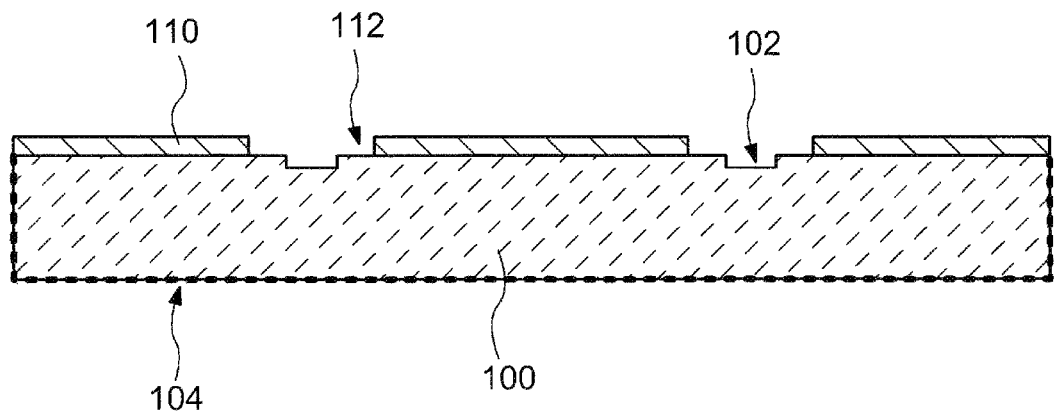
FIG. 5 shows a step of partially removing the adhesive layer in the manufacturing method of the semiconductor package in an embodiment according to the present invention.

FIG. 5 shows a step of partially removing the adhesive layer 110 in the manufacturing method of the semiconductor package 10 in embodiment 1 according to the present invention. In order to read the alignment markers 102 more precisely, parts of the adhesive layer 110 that are above the alignment markers 102 are removed to form the openings 112. The parts of the adhesive layer 110 may be removed by, for example, sublimation or ablation by laser irradiation using a $CO_2$ laser. Alternatively, the openings 112 may be formed by photolithography and etching. The openings 112 are formed in regions larger than the alignment markers 102 in order to expose the alignment markers 102 with certainty. More specifically, the openings 112 expose parts of the top surface of the support substrate 100 (surface in which the alignment markers 102 are formed). In other words, the openings 112 are each formed such that an outer edge thereof encloses an outer circumference of the corresponding alignment marker 102 as seen in a plan view.

Figure 6:
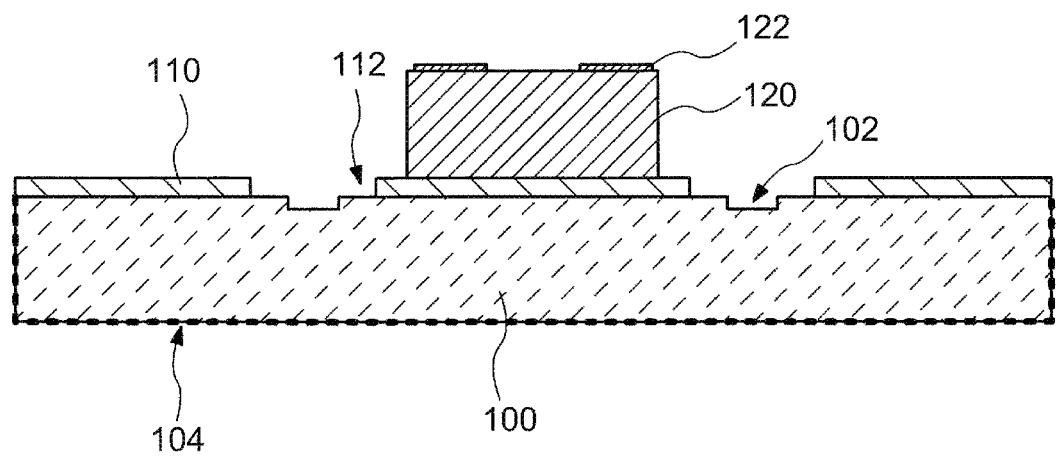
FIG. 6 shows a step of locating a semiconductor device on the support substrate in the manufacturing method of the semiconductor package in an embodiment according to the present invention.

FIG. 6 shows a step of locating the semiconductor device 120 on the support substrate 100 in the manufacturing method of the semiconductor package 10 in embodiment 1 according to the present invention. The semiconductor device 120 is positionally aligned with respect to the support substrate 100 by use of the alignment markers 102 exposed as described above, and the semiconductor device 120 having the external terminals 122 provided on a top surface thereof is located on the support substrate 100 with the adhesive layer 110 being provided between the semiconductor device 120 and the support substrate 100. The alignment markers 102 may be read by, for example, an optical microscope, a CCD camera, an electron microscope or the like. The semiconductor device 120 is mounted on the support substrate 100 with high alignment precision by this method.

Figure 7:
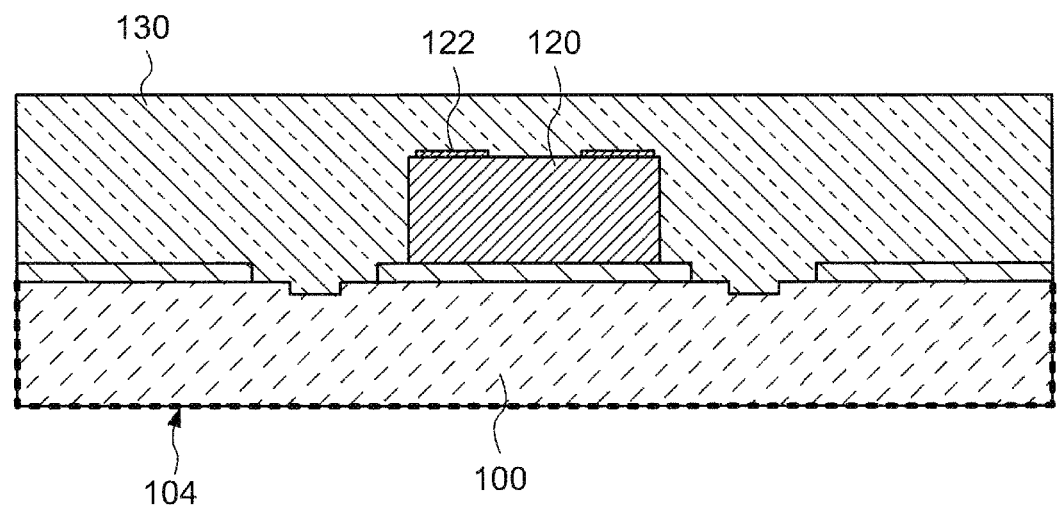
FIG. 7 shows a step of forming a first resin insulating layer in the manufacturing method of the semiconductor package in an embodiment according to the present invention.

FIG. 7 shows a step of forming the first resin insulating layer 130 in the manufacturing method of the semiconductor package 10 in embodiment 1 according to the present invention. The first resin insulating layer 130 is formed by bonding a sheet-like insulating film. Specifically, the sheet-like film is bonded to the support substrate 100 having the semiconductor device 120 mounted thereon, and then is melted by heating. The melted sheet-like film is caused to fill the recessed portions acting as the alignment markers 102 by pressurization. The first resin insulating layer 130 shown in FIG. 7 is formed of the sheet-like film by the heating and the pressurization. The first resin insulating layer 130 is formed so as to fill the openings 112 and the recessed portions acting as the alignment markers 102. In other words, the first resin insulating layer 130 is formed so as to contact the side wall of each of the openings 112. Similarly, the first insulating layer 130 is formed so as to contact the side wall of each of the recessed portions acting as the alignment markers 102. The first resin insulating layer 130 is set to have a thickness sufficient for the first insulating layer 130 to cover the semiconductor device 120. Namely, the thickness of the first insulating layer 130 is greater than the thickness (height) of the semiconductor device 120. The first resin insulating layer 130 alleviates (flattens) the stepped portions formed by the semiconductor device 120, the adhesive layer 110 and the like, and thus may be referred to as a "flattening film".

The first resin insulating layer 130 prevents connection of the semiconductor device 120 with the line 140 and connection of the external terminal 122 with the line 140 at the region other than the contact portion.

Namely, there is a gap between the semiconductor device 120 and the line 140, and between the external terminal 122 and the line 140. As long as the first insulating layer 130 is located on at least a top surface and a side surface of the assembly of the semiconductor device 120 and the external terminals 122, the thickness of the first resin insulating layer 130 may be smaller than the thickness of the semiconductor device 120. In the example shown in FIG. 7, the first resin insulating layer 130 is formed by bonding a sheet-like film. The first resin insulating layer 130 is not limited to being formed by this method. For example, the first resin insulating layer 130 may be formed by any of various methods including spin-coating, dipping, ink-jetting, vapor deposition and the like.

Figure 8:
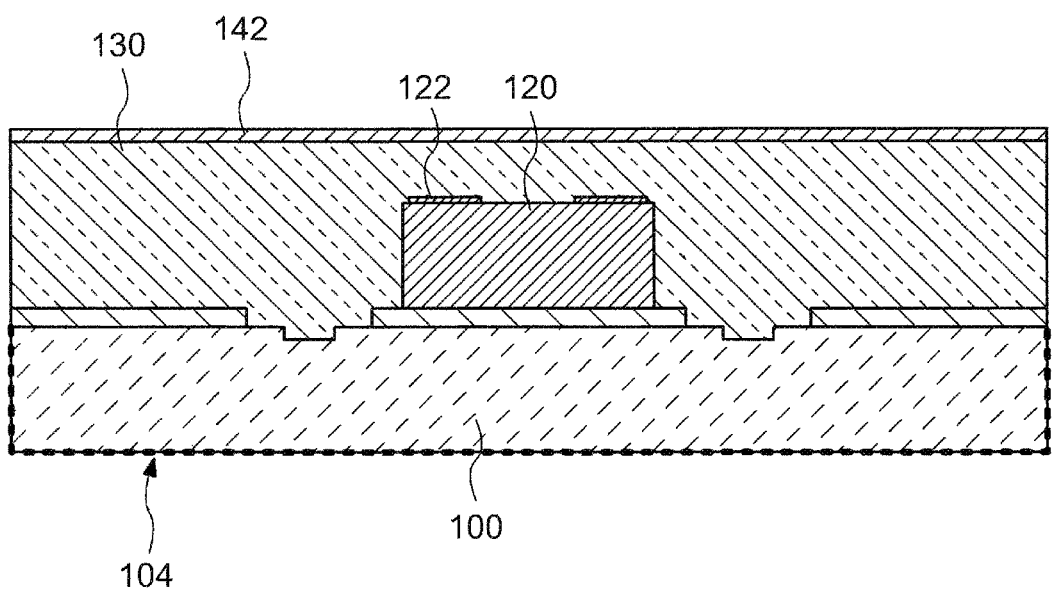
FIG. 8 shows a step of forming a first conductive layer on the first resin insulating layer in the manufacturing method of the semiconductor package in an embodiment according to the present invention.

FIG. 8 shows a step of forming the first conductive layer 142 on the first resin insulating layer 130 in the manufacturing method of the semiconductor package 10 in embodiment 1 according to the present invention. A sheet-like conductive film is bonded to the top surface of the first resin insulating layer 130. In other words, the conductive film is used as the first conductive layer 142. In this example, the first conductive layer 142 is formed by bonding a film. The first conductive layer 142 is not limited to being formed by this method. For example, the first conductive layer 142 may be formed by plating or physical vapor deposition (PVD). The PVD may be sputtering, vacuum vapor deposition, electron beam deposition, molecular beam epitaxy, or the like. Alternatively, a solvent containing a conductive resin material dissolved therein may be applied to form the first conductive layer 142.

Figure 9:
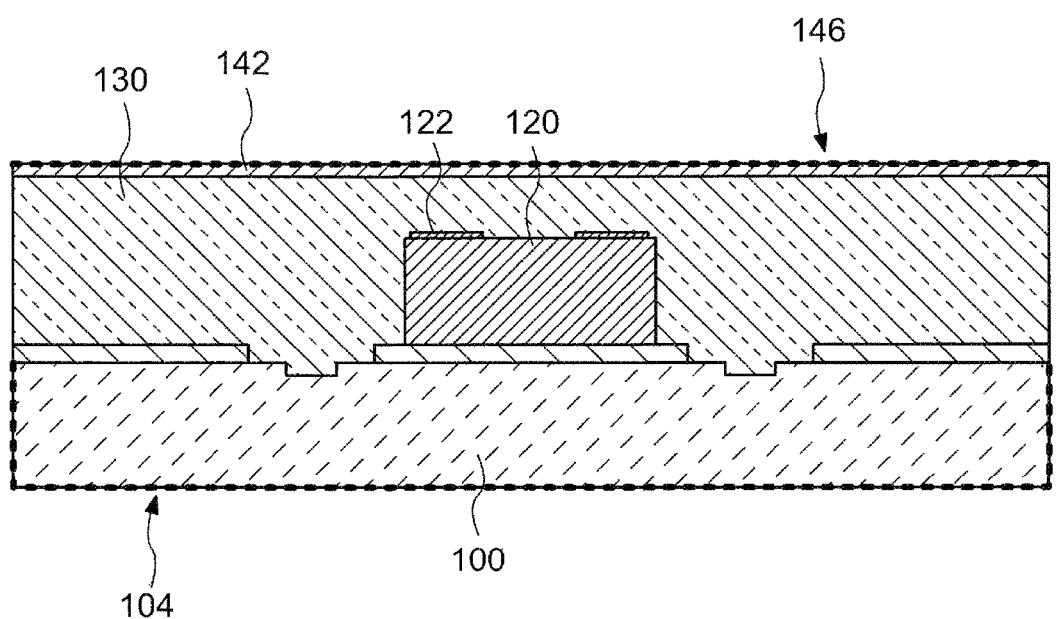
FIG. 9 shows a step of roughening a top surface of the first conductive layer in the manufacturing method of the semiconductor package in an embodiment according to the present invention.

FIG. 9 shows a step of roughening a top surface of the first conductive layer 142 in the manufacturing method of the semiconductor package 10 in embodiment 1 according to the present invention. As shown in FIG. 9, the top surface of the first conductive layer 142 formed on the first resin insulating layer 130 is roughened. The top surface of the first conductive layer 142 may be roughened by etching using a ferric chloride-containing etchant. In FIG. 9, a region 146 that is roughened (roughened region 146) is represented by the dashed line.

Figure 10:
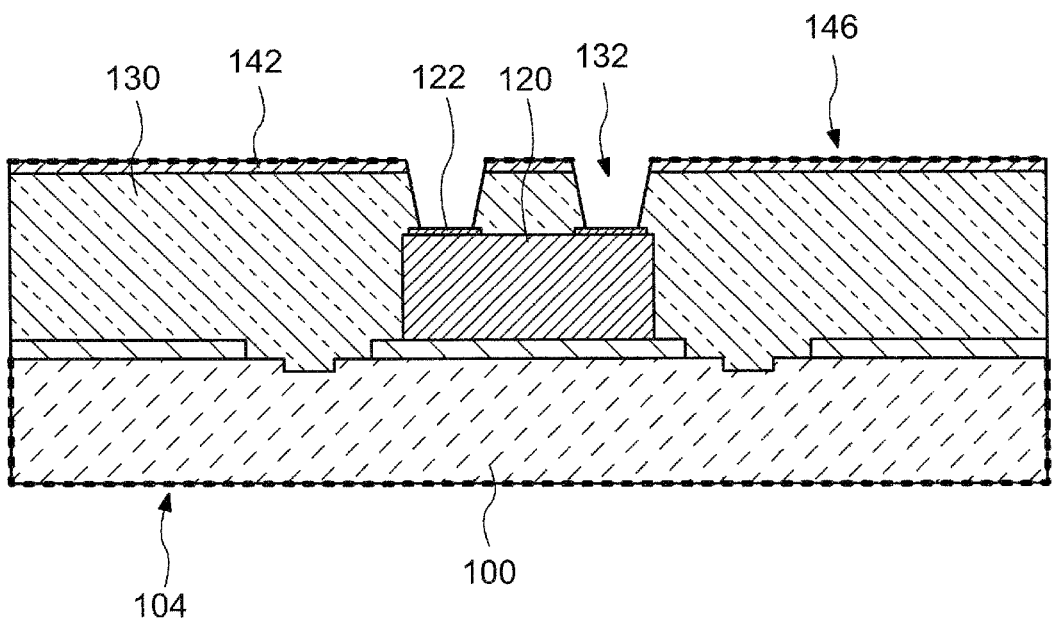
FIG. 10 shows a step of forming openings in the first resin insulating layer in the manufacturing method of the semiconductor package in an embodiment according to the present invention.

FIG. 10 shows a step of forming the openings 132 in the first resin insulating layer 130 in the manufacturing method of the semiconductor package 10 in embodiment 1 according to the present invention. As shown in FIG. 10, parts of the roughened region 146 in the top surface of the first conductive layer 142 that correspond to the external terminals 122 are irradiated with laser light to form the openings 132 exposing the external terminals 122. The openings 132 may be formed in the first conductive layer 142 and in the first resin insulating layer 130 in the same step. An example of the laser used to form the openings 132 is a $CO_2$ laser. The light generated by the $CO_2$ laser has the spot diameter and the energy amount thereof adjusted in accordance with the size of each opening 132, and is used to perform pulse irradiation a plurality of times. Since the top surface of the first conductive layer 142 has the roughened region 146, the energy of the laser light directed thereto is absorbed into the first conductive layer 142 efficiently. The laser light is directed toward a position inner to each of the external terminals 122. Namely, the laser light is directed so as not to expand beyond the pattern of the external terminals 122. In the case where a part of the semiconductor device 120 is to be processed, the laser light may be directed so as to partially expand beyond the external terminals 122 intentionally.

In the example shown in FIG. 10, a side wall of the first conductive layer 142 and a side wall of the first resin insulating layer 130 that are in each of the openings 132 are continuous to each other. The semiconductor package 10 is not limited to having such a structure. For example, in the case where the openings 132 are formed by laser irradiation, the first resin insulating layer 130 may retract in a planar direction of the support substrate 100 (direction in which the diameter of the openings 132 is enlarged) more than the first conductive layer 142. Namely, an end of the first conductive layer 142 may protrude into each opening 132 more than an end of the first resin insulating layer 130. In other words, the first conductive layer 142 may protrude like a canopy. In still other words, at the time when the openings 132 are formed, a bottom surface of the first conductive layer 142 may be partially exposed to the openings 132. In this case, the protruded portions of the first conductive layer 142 may be bent toward the outer terminals 122 in the openings 132.

Figure 11:
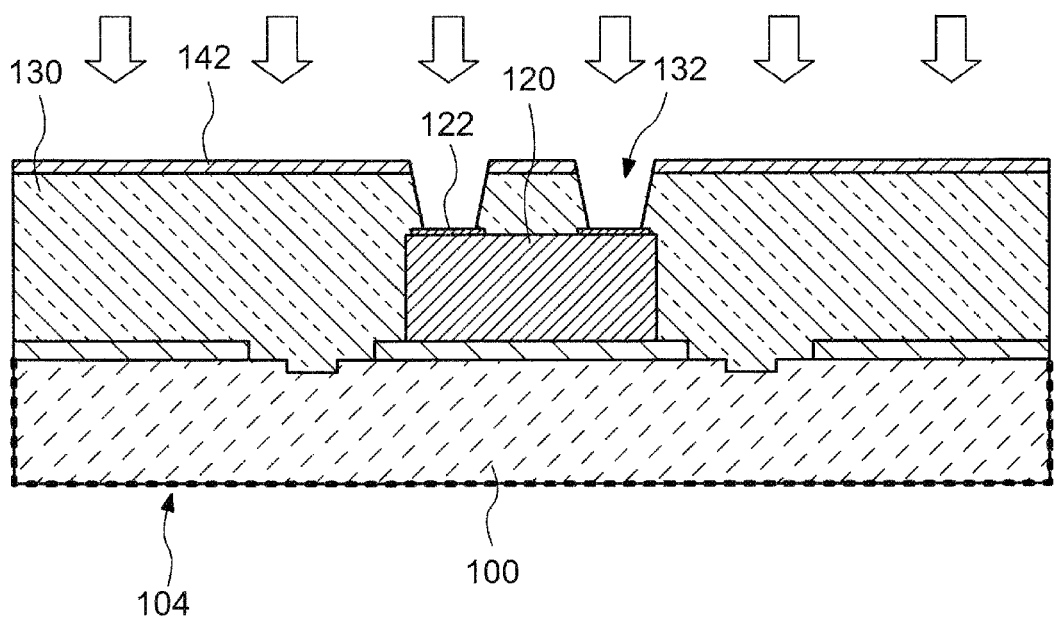
FIG. 11 shows a step of removing a roughened region of the first conductive layer and also removing residue on a bottom surface of each of the openings in the manufacturing method of the semiconductor package in an embodiment according to the present invention.

FIG. 11 shows a step of removing the roughened region 146 of the first conductive layer 142 and also removing residue on a bottom surface of each of the openings 132 in the manufacturing method of the semiconductor package 10 in embodiment 1 according to the present invention. After the openings 132 are formed, the roughened region 146 at the top surface of the first conductive layer 142 is first removed. The roughened region 146 may be removed by an acid treatment. After the roughened region 146 is removed, residue (smear) on the bottom surface of each opening 132 is removed. The removal of the residue (desmearing) is performed in two stages.

A method for removing the residue on the bottom surface of each opening 132 will be described in detail. First, the bottom surface of each opening 132 is subjected to a plasma treatment. The plasma treatment may be performed with plasma containing fluorine ($CF_4$) gas and oxygen ($O_2$) gas. The plasma treatment mainly removes parts of the first resin insulating layer 130 in the openings 132 that have not been removed by the formation of the opening 132. The plasma treatment also removes a quality-changed layer of the first resin insulating layer 130 generated by the formation of the openings 132. For example, in the case where the openings 132 are formed by laser irradiation, a layer of the first resin insulating layer 130 that is changed in quality by the energy of the laser light may remain on the bottom surfaces of the openings 132. The above-described plasma treatment removes such a quality-changed layer efficiently.

After the plasma treatment, a chemical treatment is performed. The chemical treatment may be performed with sodium permanganate or potassium permanganate. The chemical treatment removes the residue that has not been removed by the plasma treatment. For example, the filler contained in the first resin insulating layer 130 and has not been removed by the plasma treatment is removed. Sodium permanganate or potassium permanganate is an etchant having a role of etching the residue away. Before the treatment with the etchant, a swelling solution swelling the first resin insulating layer 130 may be used. After the treatment with the etchant, a neutralizing solution neutralizing the etchant may be used.

The use of the swelling solution expands a ring of resin and thus increases the wettability. This suppresses formation of a non-etched region. The use of the neutralizing solution allows the etchant to be removed efficiently, and thus suppresses an unintended progress of etching. For example, in the case where an alkaline chemical is used as the etchant, the etching may progress excessively in an unintended manner because the alkaline chemical is not easily removed by washing with water. Even in this case, the use of the neutralizing solution after the etching suppresses such an unintended progress of etching.

The swelling solution may be an organic solvent such as diethyleneglycol, monobutylether, ethyleneglycol, or the like. The neutralizing solution may be a sulfuric acid-based chemical such as hydroxylamine sulfate or the like.

For example, in the case where an inorganic filler is contained in the first resin insulating layer 130, the filler may not be removed by the plasma treatment and remain as residue. Even in such a case, the chemical treatment performed after the plasma treatment removes the residue caused by the filler.

Figure 12:
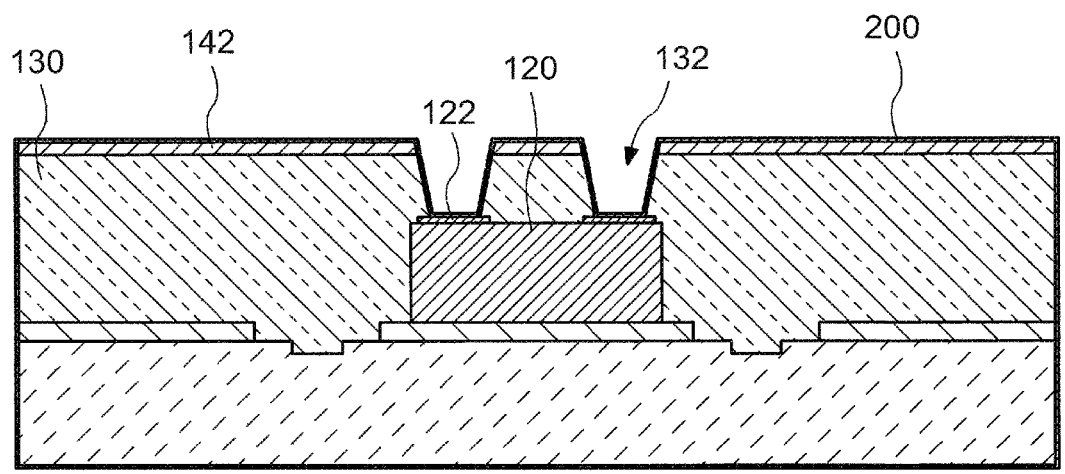
FIG. 12 shows a step of forming a conductive plating layer by electroless plating in the manufacturing method of the semiconductor package in an embodiment according to the present invention.

FIG. 12 shows a step of forming a conductive plating layer 200 by electroless plating in the manufacturing method of the semiconductor package 10 in embodiment 1 according to the present invention. The plating layer 200 (conductive body) to be connected with the external terminals 122 exposed after the above-described desmearing step is formed by electroless plating. According to the electroless plating, palladium colloid is adsorbed to a resin and immersed in a chemical solution containing Cu to replace Pd and Cu with each other, so that Cu is deposited. Since the plating layer 200 is formed by electroless plating after the roughened region 146 is removed, the adhesiveness of the plating layer 200 to the first conductive layer 142 is increased.

Figure 13:
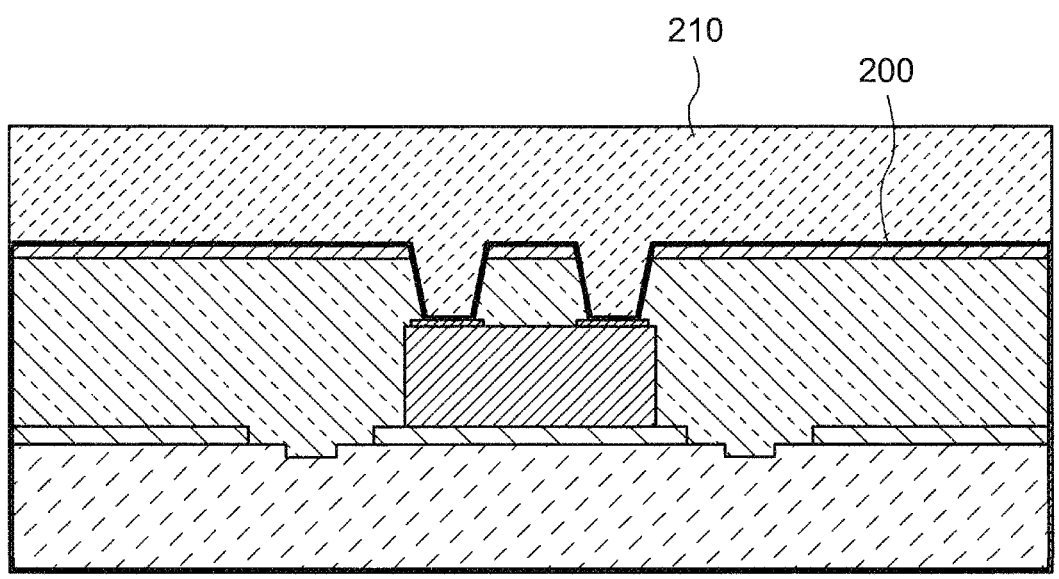
FIG. 13 shows a step of forming a photosensitive photoresist in the manufacturing method of the semiconductor package in an embodiment according to the present invention.

FIG. 13 shows a step of forming a photosensitive photoresist 210 in the manufacturing method of the semiconductor package 10 in embodiment 1 according to the present invention. As shown in FIG. 13, the photosensitive photoresist 210 is formed on the plating layer 200. The photosensitive photoresist 210 is formed by an application method such as spin-coating or the like. Before the photosensitive photoresist 210 is formed, a treatment to increase the adhesiveness between the plating layer 200 and the photosensitive photoresist 210 (hydrophobization surface treatment such as HMDS treatment or the like) may be performed. The photosensitive photoresist 210 may be of a negative type, in which case a region exposed to light is difficult to be etched by a developer, or may be of a positive type, in which case a region exposed to light is easily etched by a developer.

Figure 14:
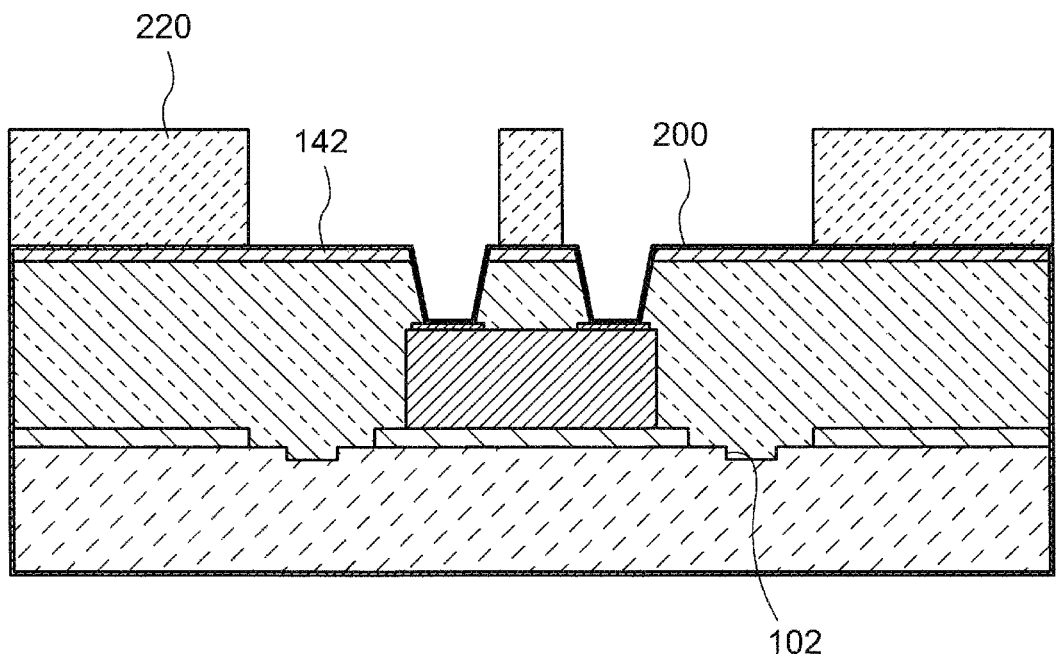
FIG. 14 shows a step of partially removing the photosensitive photoresist by photolithography in the manufacturing method of the semiconductor package in an embodiment according to the present invention.

FIG. 14 shows a step of partially removing the photosensitive photoresist 210 by photolithography in the manufacturing method of the semiconductor package 10 in embodiment 1 according to the present invention. The photosensitive photoresist 210 applied in the previous step is exposed and developed, so that parts of the photosensitive photoresist 210 that correspond to regions where the lines 140 (FIG. 1) are to be formed are removed. As a result, a resist pattern 220 shown in FIG. 14 is formed. Before the photosensitive photoresist 210 is exposed to form the resist pattern 220, positional alignment is performed by use of the alignment markers 102 formed in the support substrate 100.

Figure 15:
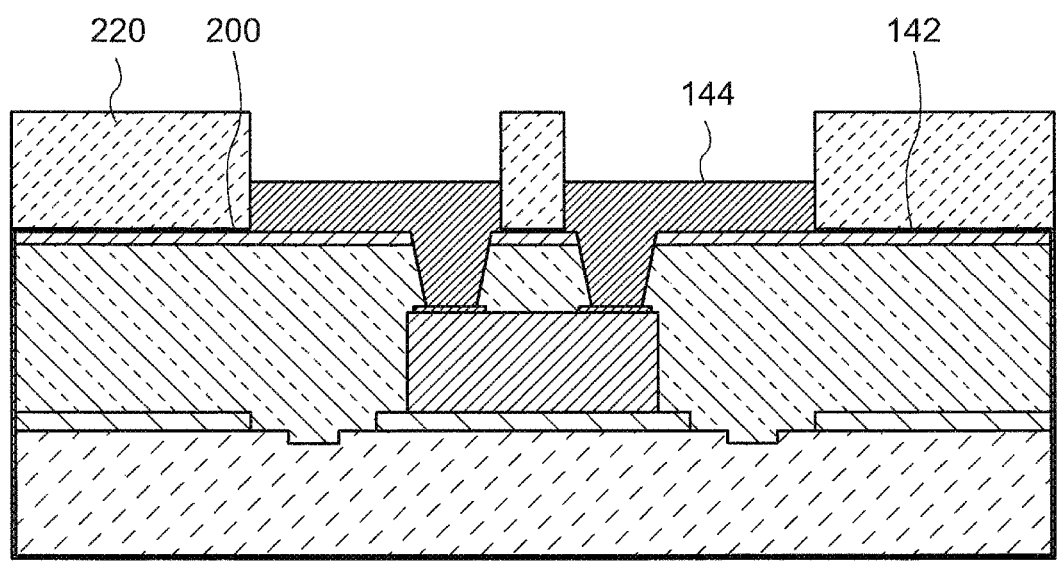
FIG. 15 shows a step of forming a second conductive layer by electroplating in the manufacturing method of the semiconductor package in an embodiment according to the present invention.

FIG. 15 shows a step of forming the second conductive layer 144 by electroplating in the manufacturing method of the semiconductor package 10 in embodiment 1 according to the present invention. After the resist pattern 220 is formed, the plating layer 200 formed by electroless plating is supplied with an electric current to perform electroplating, so that a part of the plating layer 200 that is exposed from the resist pattern 220 is grown to be thicker to form the second conductive layer 144. A part of the first conductive layer 142 and a part of the plating layer 200 that are below the resist pattern 220 will be removed when the entire surface is etched in a later step, and therefore, the thickness of the second conductive layer 144 will be also decreased. Thus, the thickness of the second conductive layer 144 is adjusted in consideration of the amount of the thickness that will be decreased in the later step.

Figure 16:
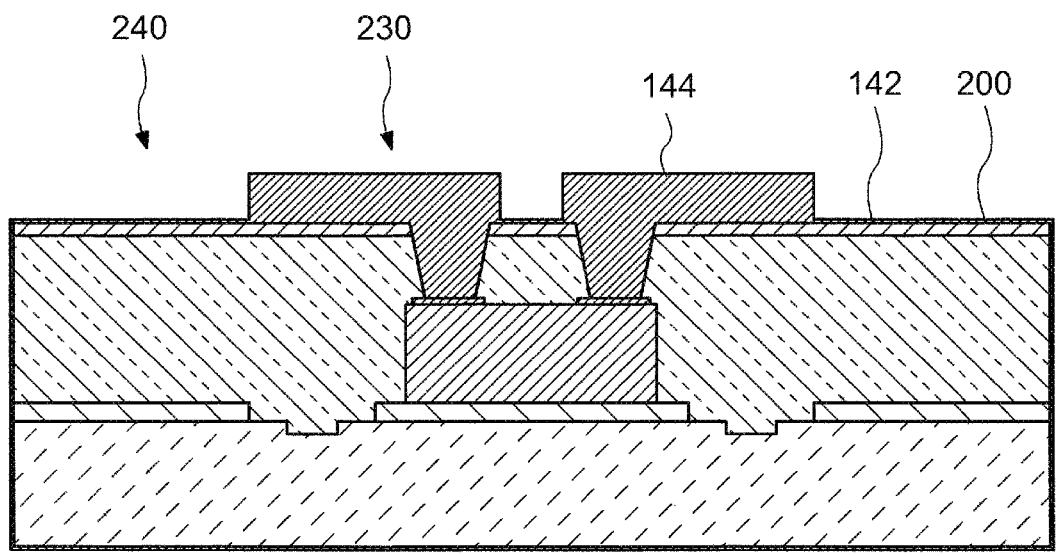
FIG. 16 shows a step of removing a resist pattern formed of the photoresist in the manufacturing method of the semiconductor package in an embodiment according to the present invention.

FIG. 16 shows a step of removing the resist pattern 220 formed of the photoresist in the manufacturing method of the semiconductor package 10 in embodiment 1 according to the present invention. As shown in FIG. 16, after the plating layer 200 is made thicker to form the second conductive layer 144, the photoresist forming the resist pattern 220 is removed by an organic solvent. The photoresist may be removed by ashing with oxygen plasma instead of by the organic solvent. As a result of the removal of the photoresist, a thick film region 230 including the second conductive layer 144 and a thin film region 240 including the plating layer 200 but not including the second conductive layer 144 are obtained. The thick film region 230 includes a thick plating layer generated as a result of the thickness of the plating layer 200 being increased by electroplating. Therefore, the second conductive layer 144 strictly includes two layers. However, FIG. 16 does not distinguish these two layers.

Figure 17:
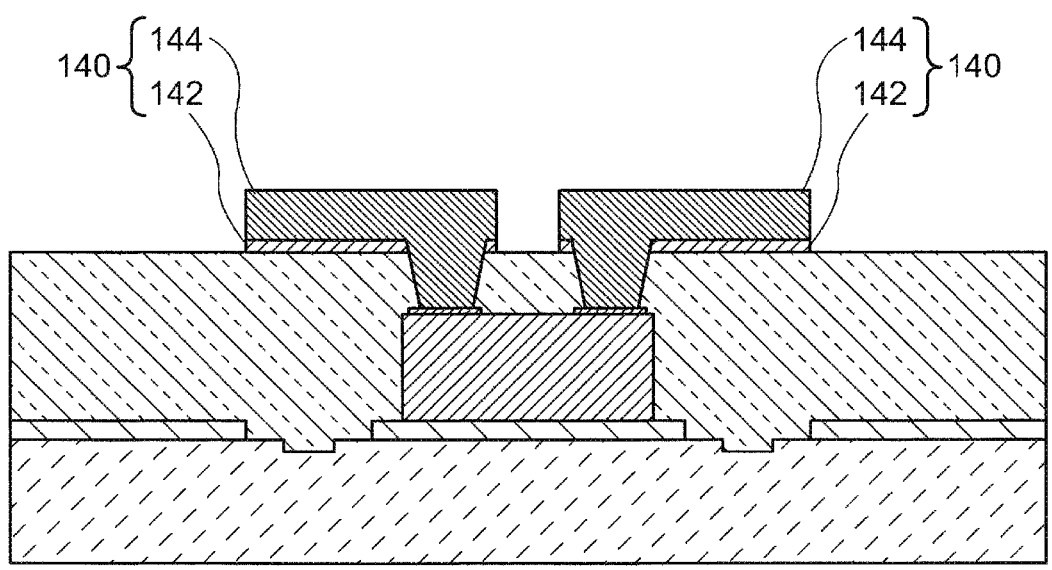
FIG. 17 shows a step of partially removing the second conductive layer to form lines in the manufacturing method of the semiconductor package in an embodiment according to the present invention.

FIG. 17 shows a step of partially removing the second conductive layer 144 to form the lines 140 in the manufacturing method of the semiconductor package 10 in embodiment 1 according to the present invention. As shown in FIG. 17, the part of the plating layer 200 and the part of the first conductive layer 142 that have not been thickened as a result of being covered with the resist pattern 220 are removed (etched away), so that the assembly of the first conductive layer 142 and the second conductive layer 144 is electrically divided into lines 140. The etching performed on the plating layer 200 and the first conductive layer 142 results in the second conductive layer 142 in the thick film region 230 being also etched from a top surface thereof and thus thinned. Therefore, it is preferable to set the original thickness of the second conductive layer 144 in consideration of the amount of thickness that is decreased in this step. The etching in this step may be wet etching or dry etching. In the example shown in FIG. 17, the lines 140, which have a one-layer structure, are formed. The semiconductor package 10 is not limited to being formed by this method. An insulating layer and a conductive layer may be stacked on the lines 140, so that a multiple-layer line including a plurality of line layers may be formed. In this case, each time a line layer is to be formed, an alignment marker may be formed to be used for positional alignment of the layers above the layers already formed.

Figure 18:
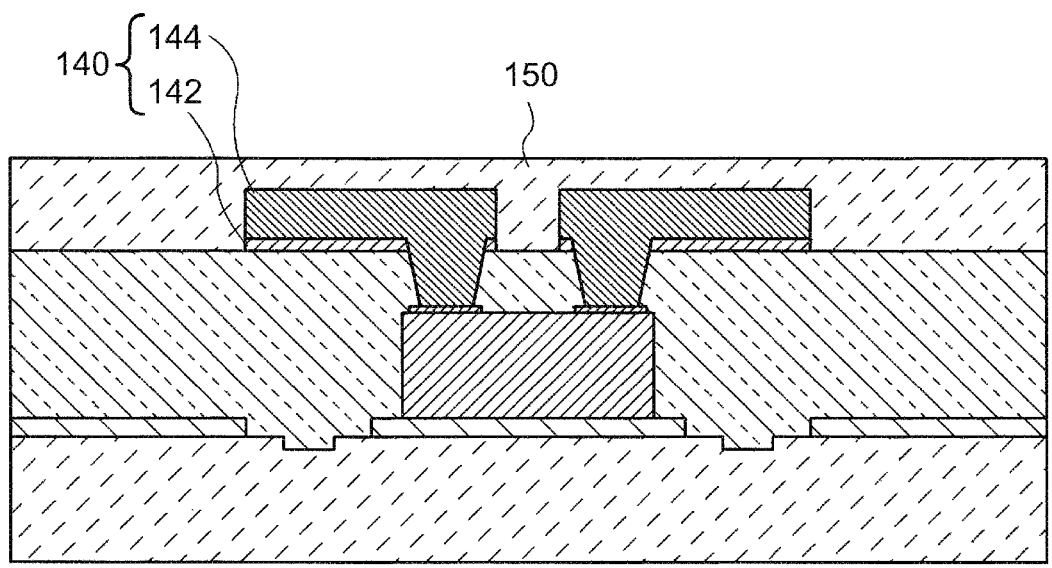
FIG. 18 shows a step of forming a second resin insulating layer covering the lines in the manufacturing method of the semiconductor package in an embodiment according to the present invention.

FIG. 18 shows a step of forming a second resin insulating layer 150 covering the lines 140 in the manufacturing method of the semiconductor package 10 in embodiment 1 according to the present invention. The second resin insulating layer 150 is formed by bonding a sheet-like insulating film and performing pressurization and heating on the sheet-like insulating film, like the first resin insulating layer 130. The second resin insulating layer 150 is set to have a thickness sufficient for the second insulating layer 150 to cover the lines 140. Namely, the thickness of the second insulating layer 150 is greater than the thickness of the lines 140. The second resin insulating layer 150 alleviates (flattens) the stepped portions formed by the lines 140 and the like, and thus may be referred to as a "flattening film".

The second resin insulating layer 150 prevents connection of the line 140 with the solder ball 160 at the region other than the contact portion. Namely, there is a gap between the line 140 and the solder ball 160. As long as the second insulating layer 150 is located on at least a top surface and a side surface of each of the lines 140, the thickness of the second resin insulating layer 150 may be smaller than the thickness of the lines 140. In the example shown in FIG. 18, the second insulating layer 150 is formed by bonding a sheet-like film. The second resin insulating layer 150 is not limited to being formed by this method. For example, the second resin insulating layer 150 may be formed by any of various methods including spin-coating, dipping, ink-jetting, vapor deposition and the like.

Figure 19:
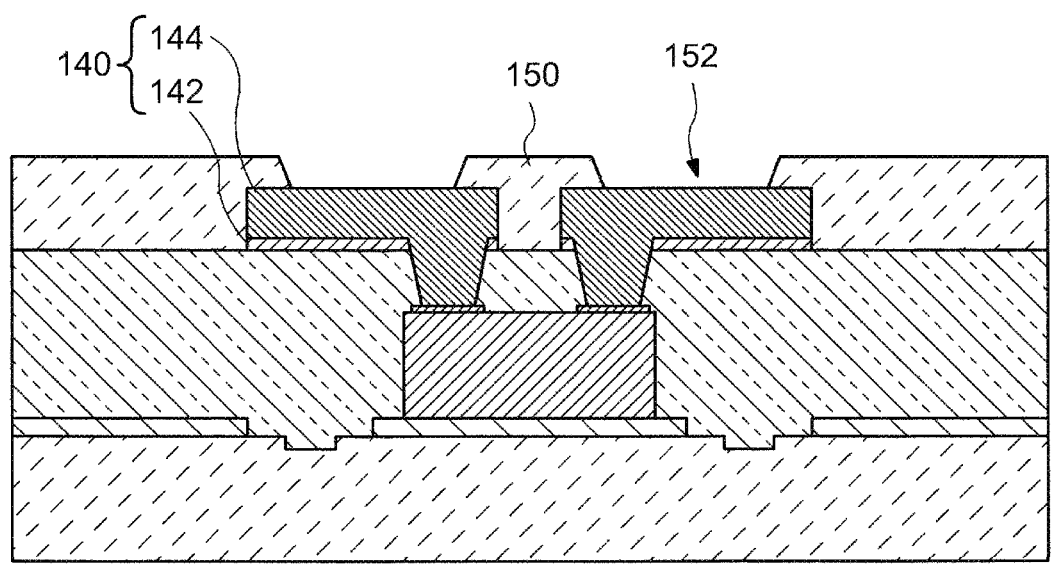
FIG. 19 shows a step of forming openings, exposing the lines, in the second resin insulating layer in the manufacturing method of the semiconductor package in an embodiment according to the present invention.

FIG. 19 shows a step of forming the openings 152, exposing the lines 140, in the second resin insulating layer 150 in the manufacturing method of the semiconductor package 10 in embodiment 1 according to the present invention. As shown in FIG. 19, the openings 152 exposing the lines 150 are formed in the second resin insulating layer 150. The openings 152 may be formed by photolithography and etching. In the case where the second resin insulating layer 150 is formed of a photosensitive resin, the openings 152 may be formed by exposure and development. The desmearing, which is performed on the openings 132 in the first resin insulating layer 130, may also be performed on the openings 152. Positional alignment may be performed to form the openings 152 by use of the alignment marker formed in the step of forming the lines 140.

Figure 20:
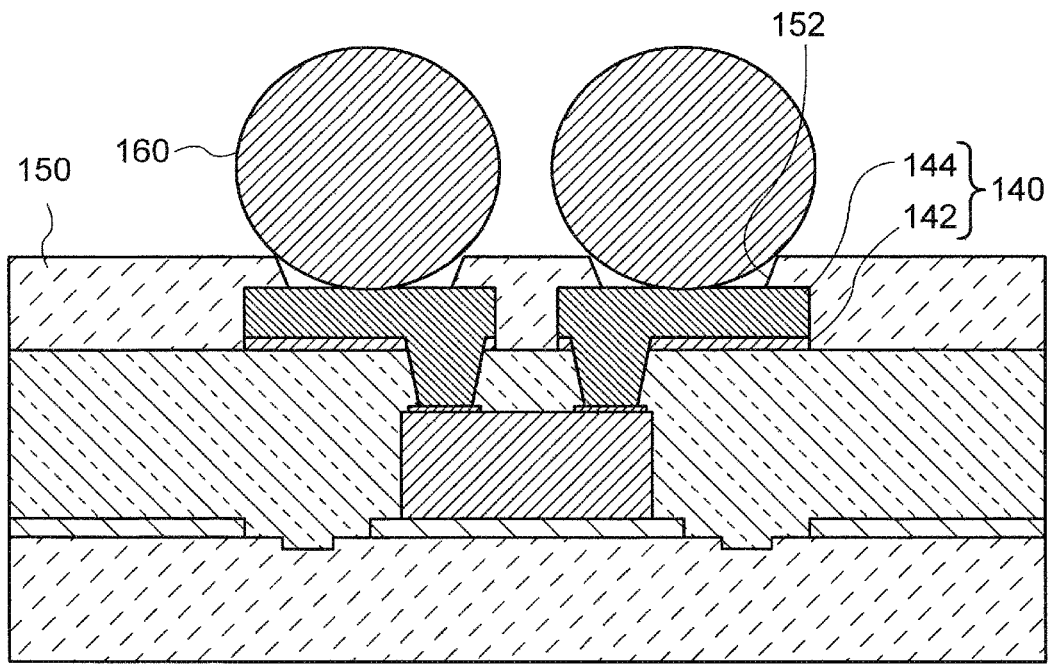
FIG. 20 shows a step of locating solder balls at positions corresponding to the exposed lines in the manufacturing method of the semiconductor package in an embodiment according to the present invention.

FIG. 20 shows a step of locating the solder balls 160 at positions corresponding to the exposed lines 140 in the manufacturing method of the semiconductor package 10 in embodiment 1 according to the present invention. As shown in FIG. 20, the solder balls 160 are located in the openings 152. In the example shown in FIG. 20, one solder ball 160 is located in one opening 152. The solder balls 160 are not limited to being located by this method. For example, a plurality of solder balls 160 may be located in one opening 152. In the example shown in FIG. 20, the solder balls 160 are in contact with the lines 140 on the stage where the solder balls 160 are located in the openings 152. The solder balls 160 are not limited to being located by this method. For example, the solder balls 160 may not be in contact with the lines 140 on the stage shown in FIG. 20. Positional alignment may be performed to locate the solder balls 160 by use of the alignment marker formed in the step of forming the lines 140.

Figure 21:
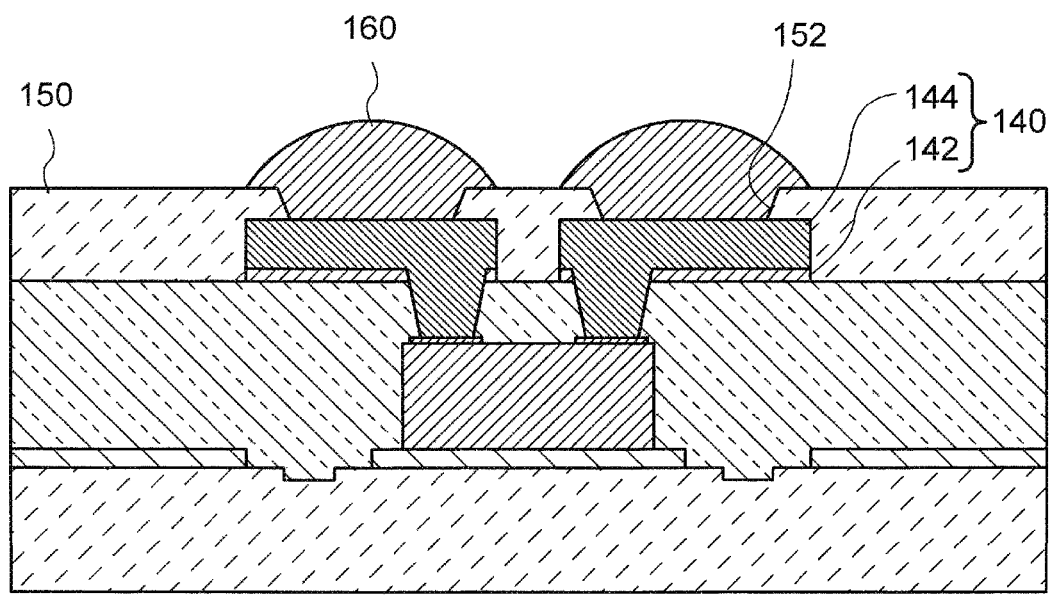
FIG. 21 shows a step of reflowing the solder balls in the manufacturing method of the semiconductor package in an embodiment according to the present invention.

FIG. 21 shows a step of reflowing the solder balls 160 in the manufacturing method of the semiconductor package 10 in embodiment 1 according to the present invention. Thermal treatment is performed in the state shown in FIG. 20 to reflow the solder balls 160. "Reflow" refers to liquefying at least a part of a solid target so as to fluidize the solid target and supplying the fluid target to a recessed portion. As a result of reflowing the solder balls 160, top surfaces of the lines 140 are entirely put into contact with the solder balls 160.

Figure 22:
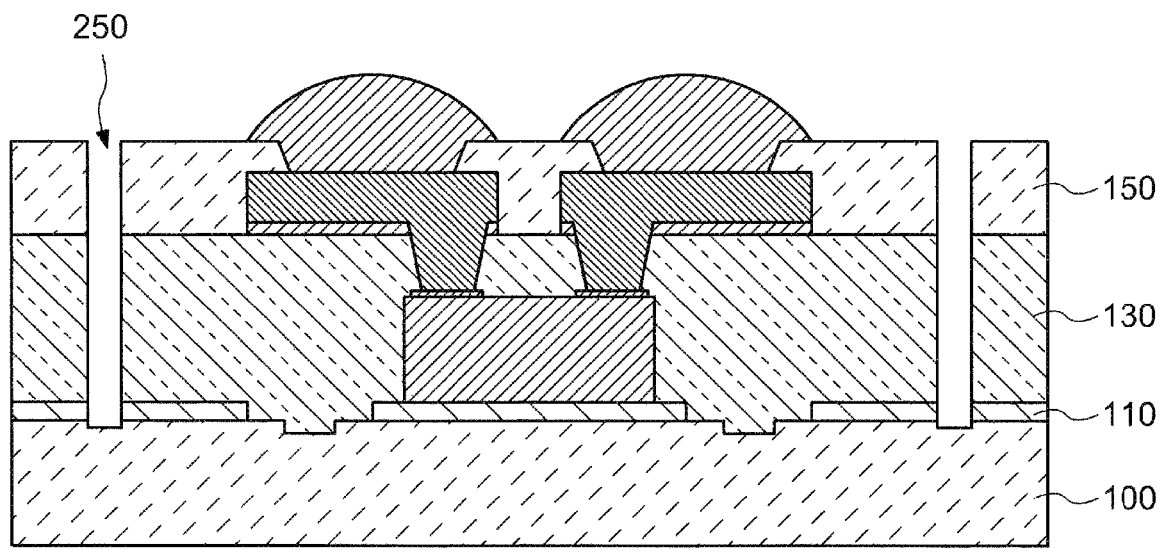
FIG. 22 shows a step of forming cuts (grooves) in the second resin insulating layer, the first resin insulating layer and the adhesive layer, so that the cuts reach the support substrate, in the manufacturing method of the semiconductor package in an embodiment according to the present invention.

FIG. 22 shows a step of forming cuts (grooves) 250 in the second resin insulating layer 150, the first resin insulating layer 130 and the adhesive layer 110, so that the cuts 250 reach the support substrate 100, in the manufacturing method of the semiconductor package 10 in embodiment 1 according to the present invention. In this example, the cuts 250 are formed by use of a dicing blade (e.g., circular rotatable blade formed of diamond) in the adhesive layer 110, the first resin insulating layer 130 and the second resin insulating layer 150. For forming the cuts 250, the above-described layers are cut by the dicing blade while the dicing blade is rotated at high speed and cooled with pure water and chips generated by the cutting is washed away with pure water. In the example shown in FIG. 22, the cuts 250 are formed in the adhesive layer 110, the first resin insulating layer 130 and the second resin insulating layer 150. The cuts 250 may be formed to reach the support substrate 100 by dicing. Namely, recessed portions may be formed at the top surface of the support substrate 100 by dicing. Alternatively, dicing may be performed such that a part of the adhesive layer 110, or the adhesive layer 110 and a part of the first resin insulating layer 130, remain.

Figure 23:
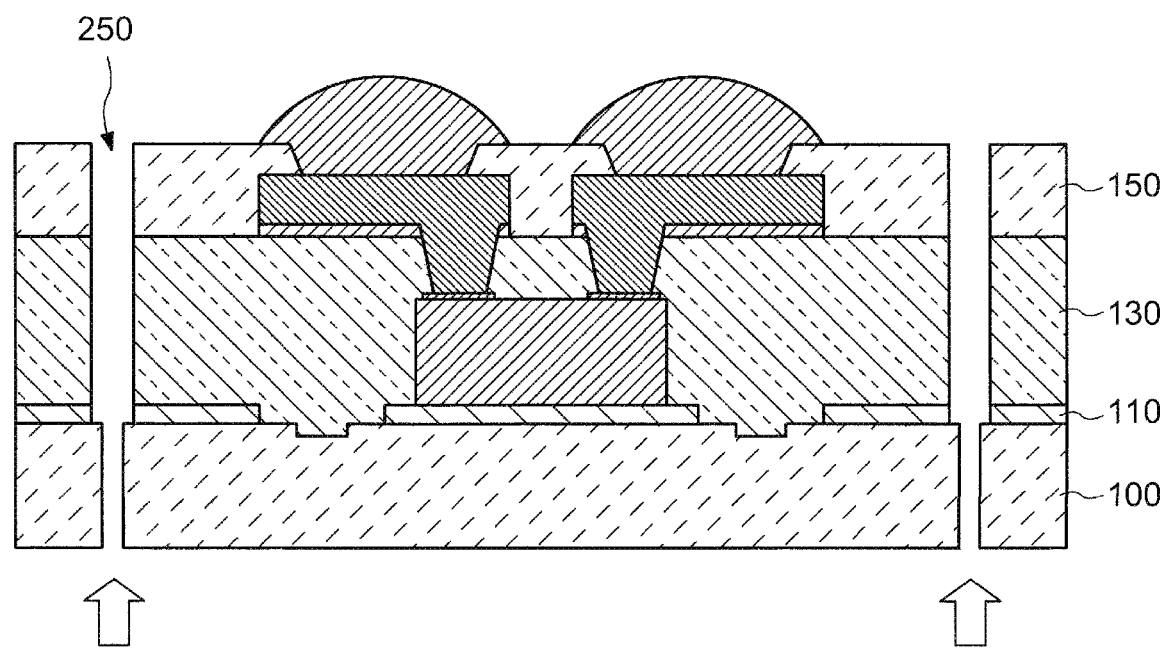
FIG. 23 shows a step of cutting the resultant assembly to form individual semiconductor packages in the manufacturing method of the semiconductor package in an embodiment according to the present invention.

FIG. 23 shows a step of cutting the resultant assembly to form individual semiconductor packages 10 in the manufacturing method of the semiconductor package 10 in embodiment 1 according to the present invention. As shown in FIG. 23, the bottom surface of the support substrate 100 (surface opposite to the surface on which the semiconductor device 120 is located) is irradiated with laser light to provide the individual semiconductor packages 10. The laser used to irradiate the support substrate 100 with laser light may be a $CO_2$ laser. Positional alignment may be performed for laser irradiation by use of the alignment markers 102 formed in the support substrate 100. The laser light is directed to a region smaller than each of the cuts 250 as seen in a plan view.

In this example, the bottom surface of the support substrate 100 is irradiated with laser light. The individual semiconductor packages 10 are not limited to being provided by this method. For example, the laser light may be directed from the side of the top surface of the support substrate 100 through the cuts 250. In this example, the laser light is directed to a region smaller than each cut 250 as seen in a plan view. The individual semiconductor packages 10 are not limited to being provided by this method. For example, the laser light may be directed to a region of an equal size to that of each cut 250 as seen in a plan view. Alternatively, the laser light may be directed to a region larger than each cut 250 as seen in a plan view.

In the case where the support substrate 100 is formed of a metal material, if the cuts are formed throughout the assembly of the adhesive layer 110, the first resin insulating layer 130, the second resin insulating layer 150 and the support substrate 100 to divide the assembly into the semiconductor packages 10, the dicing blade is significantly abraded and thus the life of the dicing blade is shortened. If the support substrate 100 formed of a metal material is mechanically processed by the dicing blade, edges of the post-processing support substrate 100 may have burr having a sharp angle, which has a risk of injuring the worker at the time of dicing. In this embodiment, the cuts 250 are mechanically formed with the dicing blade through the layers above the support substrate 100 and the support substrate is processed with laser light. Therefore, the abrasion of the dicing blade is suppressed, and the edges of the post-processing support substrate 100 are smoothed. For such a reason, especially in the case where the support substrate 100 is formed of a metal material, it is preferable that the layers above the support substrate 100 are processed by a dicing blade and the support substrate 100 is processed with laser light.

As described above, according to the manufacturing method of the semiconductor package 10 in embodiment 1, the alignment markers 102 are formed in the support substrate 100 before the semiconductor device 120 is located on the support substrate 100. This increases the alignment precision of the semiconductor device 120 with respect to the support substrate 100. Therefore, the manufacturing method of the semiconductor package 10 in embodiment 1 provides a high alignment precision at which the semiconductor device 120 is located on the support substrate 100.

Embodiment 2

Figure 24:
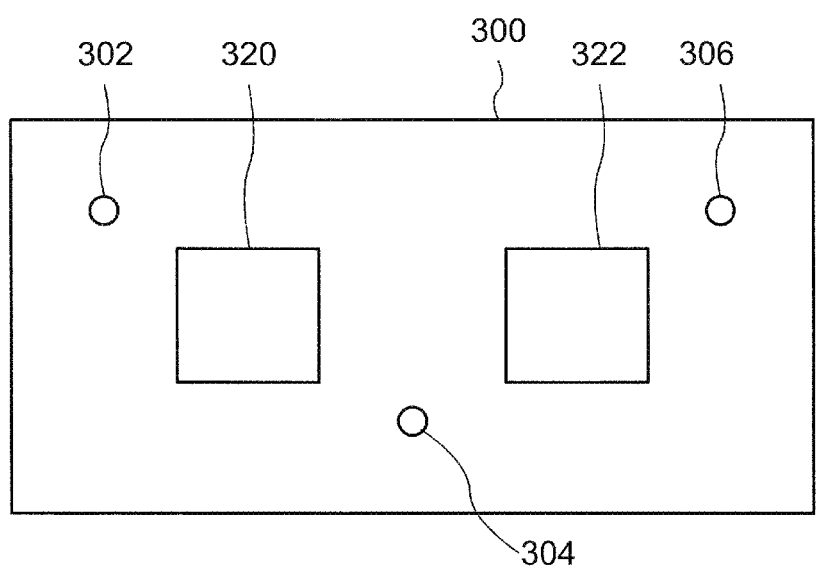
FIG. 24 is a schematic plan view showing the positional relationship between alignment markers and semiconductor devices in another embodiment according to the present invention.

With reference to FIG. 24, a method for aligning semiconductor devices with respect to a support substrate in a manufacturing method of a semiconductor package 20 in embodiment 2 according to the present invention will be described in detail. FIG. 24 is a schematic plan view showing the positional relationship between alignment markers and semiconductor devices in embodiment 2 according to the present invention. FIG. 24 shows only a support substrate 300, semiconductor devices 320 and 322 and alignment markers 302, 304 and 306 for the sake of illustration. The semiconductor package 20 may have substantially the same structure as that shown in FIG. 1A.

(Structure of the Semiconductor Package 20)

As shown in FIG. 24, the semiconductor package 20 includes a first alignment marker 302 (first recessed portion), a second alignment marker 304 (second recessed portion) and a third alignment marker 306 (third recessed portion) provided in the support substrate 300, in the vicinity of a first semiconductor device 320 and a second semiconductor device 322. The first alignment marker 302 and the second alignment marker 304 are provided at positions extended from a diagonal line of the first semiconductor device 320 as seen in a plan view. The second alignment marker 304 and the third alignment marker 306 are provided at positions extended from a diagonal line of the second semiconductor device 322 as seen in a plan view. In other words, the second alignment marker 304 is provided between the first semiconductor device 320 and the second semiconductor device 322.

(Alignment Method in the Manufacturing Method of the Semiconductor Package 20)

With reference to FIG. 24, the method for aligning the first semiconductor device 320 and the second semiconductor device 322 will be described in detail. First, the first alignment marker 302, the second alignment marker 304 and the third alignment marker 306 are formed in the support substrate 300 by substantially the same method as shown in FIG. 2. Next, the first semiconductor device 320 is located with positional alignment being performed by use of the first alignment marker 302 and the second alignment marker 304 by substantially the same method as shown in FIG. 6. The second semiconductor device 322 is located with positional alignment being performed by use of the second alignment marker 304 and the third alignment marker 306 by substantially the same method as shown in FIG. 6. Then, the first resin insulating layer 130 covering the first semiconductor device 320 and the second semiconductor device 322 is formed. Except for the above steps, the semiconductor package 20 is manufactured by substantially the same method as shown in FIG. 2 through FIG. 23.

As described above, according to the manufacturing method of the semiconductor package 20 in embodiment 2, the second alignment marker 304, among the three alignment markers 302, 304 and 306, is shared for locating the first semiconductor device 320 and the second semiconductor device 322. In other words, the number of the alignment markers used to locate the semiconductor devices 320 and 322 in the manufacturing method of the semiconductor package 20 in embodiment 2 is smaller than the number of the alignment markers used to locate two semiconductor devices 120 in the manufacturing method of the semiconductor package 10 in embodiment 1. More specifically, with the manufacturing method of the semiconductor package 10 in embodiment 1, two alignment markers 102 are used to locate one semiconductor device 120. By contrast, with the manufacturing method of the semiconductor package 20 in embodiment 2, three alignment markers 302, 304 and 306 are used to locate two semiconductor devices 320 and 322. Namely, with the manufacturing method of the semiconductor package 20, 1.5 alignment markers are used for positional alignment to locate one semiconductor device. With the manufacturing method of the semiconductor package 20, less than two alignment markers are used for positional alignment to locate one semiconductor device.

In the step of forming the assembly of layers into individual semiconductor packages 20 in the manufacturing method in embodiment 2, the support substrate 300 may be divided such that the second alignment marker 304 is included in either one of a semiconductor package 20 including the first semiconductor device 320 and a semiconductor package 20 including the second semiconductor device 322. Alternatively, the support substrate 300 may be divided such that the second alignment marker 304 is divided into two; more specifically, such that a part of the second alignment marker 304 is included in the semiconductor package 20 including the first semiconductor device 320 and the remaining part of the second alignment marker 304 is included in the semiconductor package 20 including the second semiconductor device 322. Still alternatively, the support substrate 300 may be divided such that the second alignment marker 304 is not included in the semiconductor package 20 including the first semiconductor device 320 or the semiconductor package 20 including the second semiconductor device 322. Namely, the number of the alignment markers included in each individual semiconductor package 20 may be less than two.

As described above, the manufacturing method of the semiconductor package 20 in embodiment 2 decreases the number of alignment markers used to locate one semiconductor device. This method shortens the step of forming the alignment markers. This is effective in the case where it is difficult to provide a sufficiently large region for the alignment markers.

Embodiment 3

Figure 25:
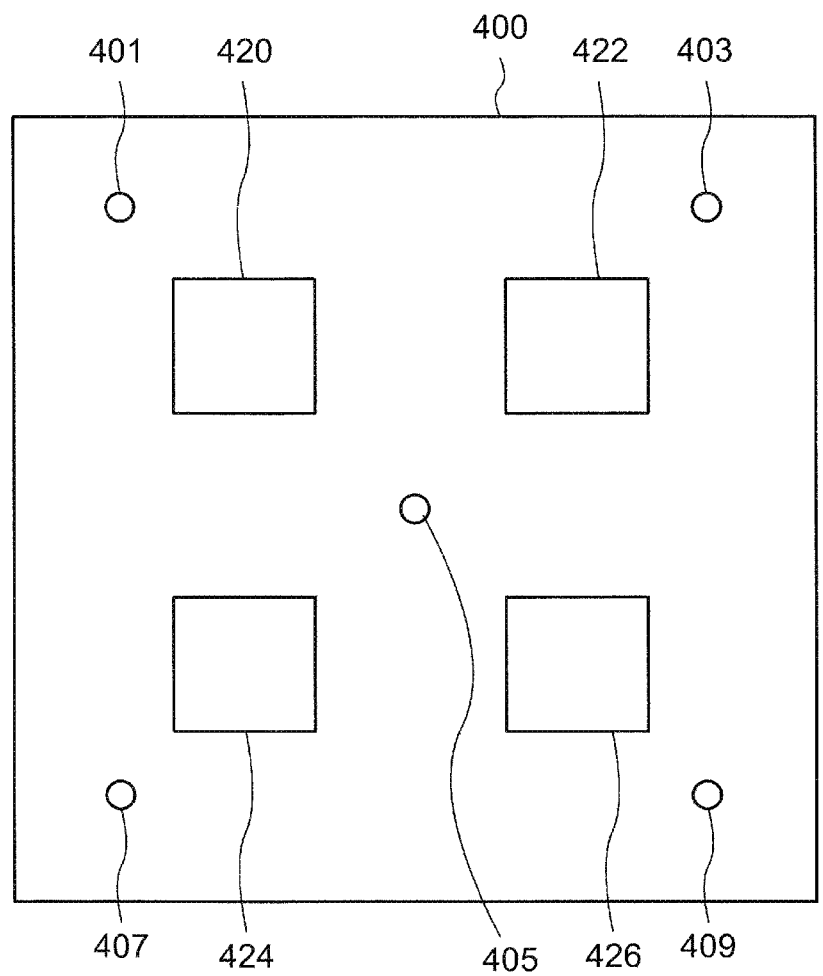
FIG. 25 is a schematic plan view showing the positional relationship between alignment markers and semiconductor devices in still another embodiment according to the present invention.

With reference to FIG. 25, a method for aligning semiconductor devices with respect to a support substrate in a manufacturing method of a semiconductor package 30 in embodiment 3 according to the present invention will be described in detail. FIG. 25 is a schematic plan view showing the positional relationship between alignment markers and semiconductor devices in embodiment 3 according to the present invention. FIG. 25 shows only a support substrate 400, semiconductor devices 420, 422, 424 and 426 and alignment markers 401, 403, 405, 407 and 409 for the sake of illustration. The semiconductor package 30 may have substantially the same structure as that shown in FIG. 1A.

(Structure of the Semiconductor Package 30)

As shown in FIG. 25, the semiconductor package 30 includes a first alignment marker 401, a second alignment marker 403, a third alignment marker 405, a fourth alignment marker 407 and a fifth alignment marker 409 provided in the support substrate 400, in the vicinity of a first semiconductor device 420, a second semiconductor device 422, a third semiconductor device 424 and a fourth semiconductor device 426.

The first alignment marker 401 and the third alignment marker 405 are provided at positions extended from a diagonal line of the first semiconductor device 420 as seen in a plan view. The second alignment marker 403 and the third alignment marker 405 are provided at positions extended from a diagonal line of the second semiconductor device 422 as seen in a plan view. The third alignment marker 405 and the fourth alignment marker 407 are provided at positions extended from a diagonal line of the third semiconductor device 424 as seen in a plan view. The third alignment marker 405 and the fifth alignment marker 409 are provided at positions extended from a diagonal line of the fourth semiconductor device 426 as seen in a plan view. In other words, the third alignment marker 405 is provided between the first semiconductor device 420, the second semiconductor device 422, the third semiconductor device 424 and the fourth semiconductor device 426.

(Alignment Method in the Manufacturing Method of the Semiconductor Package 30)

With reference to FIG. 25, the method for aligning the first semiconductor device 420, the second semiconductor device 422, the third semiconductor device 424 and the fourth semiconductor device 426 will be described in detail. First, the first alignment marker 401, the second alignment marker 403, the third alignment marker 405, the fourth alignment marker 407 and the fifth alignment marker 409 are formed in the support substrate 400 by substantially the same method as shown in FIG. 2. Next, the first semiconductor device 420 is located with positional alignment being performed by use of the first alignment marker 401 and the third alignment marker 405 by substantially the same method as shown in FIG. 6. The second semiconductor device 422 is located with positional alignment being performed by use of the second alignment marker 403 and the third alignment marker 405 by substantially the same method as shown in FIG. 6. The third semiconductor device 424 is located with positional alignment being performed by use of the third alignment marker 405 and the fourth alignment marker 407 by substantially the same method as shown in FIG. 6. The fourth semiconductor device 426 is located with positional alignment being performed by use of the third alignment marker 405 and the fifth alignment marker 409 by substantially the same method as shown in FIG. 6. Then, the first resin insulating layer 130 covering the first semiconductor device 420, the second semiconductor device 422, the third semiconductor device 424 and the fourth semiconductor device 426 is formed. Except for the above steps, the semiconductor package 30 is manufactured by substantially the same method as shown in FIG. 2 through FIG. 23.

As described above, according to the manufacturing method of the semiconductor package 30 in embodiment 3, the third alignment marker 405, among the five alignment markers 401, 403, 405, 407 and 409, is shared for locating the first semiconductor device 420, the second semiconductor device 422, the third semiconductor device 424 and the fourth semiconductor device 426. In other words, the number of the alignment markers used to locate the semiconductor devices 420, 422, 424 and 426 in the manufacturing method of the semiconductor package 30 in embodiment 3 is smaller than the number of the alignment markers used to locate four semiconductor devices 120 in the manufacturing method of the semiconductor package 10 in embodiment 1. More specifically, with the manufacturing method of the semiconductor package 10 in embodiment 1, two alignment markers 102 are used to locate one semiconductor device 120. By contrast, with the manufacturing method of the semiconductor package 30 in embodiment 3, five alignment markers 401, 403, 405, 407 and 409 are used to locate four semiconductor devices 420, 422, 424 and 426. Namely, with the manufacturing method of the semiconductor package 30, 1.25 alignment markers are used for positional alignment to locate one semiconductor device. With the manufacturing method of the semiconductor package 30, less than two alignment markers are used for positional alignment to locate one semiconductor device.

In the step of forming the assembly of layers into individual semiconductor packages 30 in the manufacturing method in embodiment 3, the support substrate 400 may be divided such that the third alignment marker 405 is included in either one of a semiconductor package 30 including the first semiconductor device 420, a semiconductor package 30 including the second semiconductor device 422, a semiconductor package 30 including the third semiconductor device 424 and a semiconductor package 30 including the fourth semiconductor device 426. Alternatively, the support substrate 400 may be divided into two, three or four. Still alternatively, the support substrate 400 may be divided such that the third alignment marker 405 is not included in any of the semiconductor package 30 including the first semiconductor device 420, the semiconductor package 30 including the second semiconductor device 422, the semiconductor package 30 including the third semiconductor device 424 and the semiconductor package 30 including the fourth semiconductor device 426. Namely, the number of the alignment markers included in each individual semiconductor package 30 may be less than two.

As described above, the manufacturing method of the semiconductor package 30 in embodiment 3 decreases the number of alignment markers used to locate each semiconductor device. This method shortens the step of forming the alignment markers.

The present invention is not limited to any of the above-described embodiments, and may be modified appropriately without departing from the gist of the present invention.

What is claimed is:

1. A semiconductor package, comprising:
   a substrate having at least one recessed portion;
   a semiconductor device located on a surface of the substrate, the surface having the at least one recessed portion;
   a resin insulating layer covering the semiconductor device; and
   an adhesive layer between the substrate and the semiconductor device,
   wherein
   the adhesive layer has an opening exposing the at least one recessed portion,
   an edge of the opening surrounds the at least one recessed portion in a planar view, and
   any structure that comprises a conductive material and that is connected to the semiconductor device is not located at the opening.

2. The semiconductor package according to claim 1, wherein:
   the resin insulating layer is in contact with a side wall of the opening.

3. The semiconductor package according to claim 1, wherein:
   the at least one recessed portion includes at least two recessed portions; and
   the at least two recessed portions are located at positions corresponding to opposing corners of the semiconductor device as seen in a planar view.

4. The semiconductor package according to claim 2, wherein the resin insulating layer is in contact with a side wall of the at least one recessed portion.

5. The semiconductor package according to claim 4, wherein the resin insulating layer fills the at least one recessed portion.

6. The semiconductor package according to claim 5, wherein:
   the at least one recessed portion includes at least two recessed portions; and
   the at least two recessed portions are located at positions corresponding to opposing corners of the semiconductor device as seen in a planar view.

7. The semiconductor package according to claim 6, wherein the at least two recessed portions each have a size of 0.05 mm or greater and 1.0 mm or less.

8. The semiconductor package according to claim 6, wherein the at least two recessed portions each have a size of 0.1 mm or greater and 0.3 mm or less.

9. The semiconductor package according to claim 8, wherein a distance between each of the at least two recessed portions and the semiconductor device is 0.05 mm or greater and 0.5 mm or less.

10. The semiconductor package according to claim 1, wherein the edge of the opening surrounds the at least one recess portion continuously.

11. The semiconductor package according to claim 1, wherein the edge of the opening surrounds the at least one recess portion continuously 360 degrees.

12. The semiconductor package according to claim 1, further comprising a line connecting to the semiconductor device,
   wherein
      the resin insulating layer is located above the semiconductor device, and
      the line is located above the semiconductor device and the resin insulating layer.

13. The semiconductor package according to claim 12, further comprising a solder ball connecting to the line,
   wherein the solder ball is located above the line.

* * * * *